(12) United States Patent
Zilkie et al.

(10) Patent No.: US 12,368,283 B2
(45) Date of Patent: Jul. 22, 2025

(54) BROADBAND ARBITRARY WAVELENGTH MULTICHANNEL LASER SOURCE

(71) Applicant: ROCKLEY PHOTONICS LIMITED, Altrincham (GB)

(72) Inventors: Aaron John Zilkie, Pasadena, CA (US); Pradeep Srinivasan, Fremont, CA (US); Andrea Trita, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 729 days.

(21) Appl. No.: 17/675,512

(22) Filed: Feb. 18, 2022

(65) Prior Publication Data

US 2022/0200244 A1 Jun. 23, 2022

Related U.S. Application Data

(63) Continuation-in-part of application No. 17/519,412, filed on Nov. 4, 2021, now abandoned, which is a
(Continued)

(51) Int. Cl.
*H01S 5/40* (2006.01)
*G02B 6/293* (2006.01)
(Continued)

(52) U.S. Cl.
CPC ........ *H01S 5/4087* (2013.01); *G02B 6/29344* (2013.01); *H01S 5/06837* (2013.01);
(Continued)

(58) Field of Classification Search
CPC . H01S 5/14; H01S 5/141; H01S 5/142; H01S 5/4087; H01S 5/0601; H01S 5/4012
See application file for complete search history.

(56) References Cited

U.S. PATENT DOCUMENTS 4,794,346 A 12/1988 Miller
4,896,325 A 1/1990 Coldren
(Continued)

FOREIGN PATENT DOCUMENTS

CN 103718398 A 4/2014
CN 103733448 A 4/2014
(Continued)

OTHER PUBLICATIONS

Chinese Notification of the First Office Action, for Patent Application No. 201880020394.3, mailed Jul. 18, 2022, 6 pages.
(Continued)

*Primary Examiner* — Sean P Hagan
(74) *Attorney, Agent, or Firm* — Womble Bond Dickinson (US) LLP

(57) ABSTRACT

A multi-channel laser source, including: a bus waveguide coupled, at an output end of the bus waveguide, to an output of the multi-channel laser source; a first semiconductor optical amplifier; a first back mirror; a first wavelength-dependent coupler, having a first resonant wavelength, on the bus waveguide; a second semiconductor optical amplifier; a second back mirror; and a second wavelength-dependent coupler, on the bus waveguide, having a second resonant wavelength, different from the first resonant wavelength. In some embodiments the first semiconductor optical amplifier is coupled to the bus waveguide by the first wavelength-dependent coupler, which is nearer to the output end of the bus waveguide than the second wavelength-dependent coupler, the second semiconductor optical amplifier is coupled to the bus waveguide by the second wavelength-dependent coupler, and the first wavelength-dependent coupler is configured to transmit light, at the second resonant wavelength, along the bus waveguide.

20 Claims, 22 Drawing Sheets

Related U.S. Application Data continuation of application No. 17/327,508, filed on May 21, 2021, now abandoned, which is a continuation of application No. 17/172,033, filed on Feb. 9, 2021, now abandoned, which is a continuation of application No. 17/104,929, filed on Nov. 25, 2020, now abandoned, which is a continuation of application No. 17/022,901, filed on Sep. 16, 2020, now abandoned, which is a continuation of application No. 16/007,896, filed on Jun. 13, 2018, now Pat. No. 10,811,848.

(60) Provisional application No. 62/548,917, filed on Aug. 22, 2017, provisional application No. 62/519,754, filed on Jun. 14, 2017.

(51) Int. Cl.
    *H01S 5/0683*     (2006.01)
    *H01S 5/14*     (2006.01)

(52) U.S. Cl.
    CPC ............ *H01S 5/142* (2013.01); *H01S 5/4062* (2013.01); *H01S 5/4068* (2013.01)

(56) References Cited

U.S. PATENT DOCUMENTS

| | | |
|---|---|---|
| 5,379,354 A | 1/1995 | Jenkins |
| 5,396,570 A | 3/1995 | Jenkins et al. |
| 5,757,986 A | 5/1998 | Crampton et al. |
| 5,870,417 A | 2/1999 | Verdiell et al. |
| 5,987,050 A | 11/1999 | Doerr et al. |
| 6,101,210 A | 8/2000 | Bestwick et al. |
| 6,108,478 A | 8/2000 | Harpin et al. |
| 6,208,679 B1 | 3/2001 | Sanchez et al. |
| 6,298,177 B1 | 10/2001 | House |
| 6,560,010 B1 | 5/2003 | DiJaili et al. |
| 6,570,893 B1 | 5/2003 | Libatique et al. |
| 6,571,038 B1 | 5/2003 | Joyner et al. |
| 6,728,279 B1 | 4/2004 | Sarlet et al. |
| 6,768,827 B2 | 7/2004 | Yoo |
| 6,873,763 B2 | 3/2005 | Nikonov |
| 7,072,542 B2 | 7/2006 | Jenkins et al. |
| 7,145,923 B2 | 12/2006 | Carter et al. |
| 7,505,686 B2 | 3/2009 | Jennen |
| 7,672,348 B2 | 3/2010 | Patchell et al. |
| 7,885,492 B2 | 2/2011 | Welch et al. |
| 8,040,932 B2 | 10/2011 | Patchell |
| 8,295,315 B2 | 10/2012 | Ward et al. |
| 8,346,028 B2 | 1/2013 | Feng et al. |
| 8,368,995 B2 | 2/2013 | Dallesasse et al. |
| 8,493,976 B2 | 7/2013 | Lin |
| 8,559,470 B2 | 10/2013 | Dallesasse et al. |
| 8,724,988 B2 | 5/2014 | Andriolli et al. |
| 8,774,625 B2 | 7/2014 | Binkert et al. |
| 8,908,723 B2 | 12/2014 | Yoffe et al. |
| 8,942,559 B2 | 1/2015 | Binkert et al. |
| 9,118,165 B1 | 8/2015 | Norberg et al. |
| 9,270,078 B2 | 2/2016 | Rickman et al. |
| 9,391,696 B1 | 7/2016 | Orcutt |
| 9,509,114 B1 | 11/2016 | Norberg et al. |
| 9,660,411 B2 | 5/2017 | Rickman et al. |
| 9,705,282 B2 | 7/2017 | Takabayashi et al. |
| 9,812,845 B1 | 11/2017 | Lee et al. |
| 10,811,848 B2 | 10/2020 | Zilkie et al. |
| 2002/0179929 A1* | 12/2002 | Takahashi ............. H01S 5/0265 257/184 |
| 2003/0067678 A1 | 4/2003 | Shibata et al. |
| 2003/0123784 A1 | 7/2003 | Mukai |
| 2004/0190562 A1 | 9/2004 | Nakano et al. |
| 2004/0228564 A1 | 11/2004 | Gunn et al. |
| 2006/0092993 A1 | 5/2006 | Frankel |
| 2007/0127531 A1 | 6/2007 | Kovsh et al. |
| 2007/0211775 A1* | 9/2007 | Patchell ................. H01S 5/1021 372/50.1 |
| 2008/0166134 A1 | 7/2008 | McCallion et al. |
| 2008/0192781 A1 | 8/2008 | O'Gorman |
| 2008/0232409 A1* | 9/2008 | Yamazaki .......... G02B 6/12004 372/20 |
| 2009/0324173 A1 | 12/2009 | Asghari |
| 2010/0189143 A1 | 7/2010 | Fukuda |
| 2010/0246612 A1* | 9/2010 | Shimizu ................. H01S 5/0602 372/18 |
| 2011/0149381 A1 | 6/2011 | Hatakeyama |
| 2011/0206313 A1 | 8/2011 | Dong et al. |
| 2011/0235659 A1 | 9/2011 | Fukuda |
| 2011/0286477 A1 | 11/2011 | Kuksenkov et al. |
| 2012/0057610 A1 | 3/2012 | Dallesasse et al. |
| 2012/0062900 A1 | 3/2012 | Langley et al. |
| 2013/0016423 A1 | 1/2013 | Zheng et al. |
| 2013/0051798 A1 | 2/2013 | Chen et al. |
| 2013/0235890 A1 | 9/2013 | Creazzo et al. |
| 2014/0153601 A1 | 6/2014 | Doerr et al. |
| 2014/0185980 A1 | 7/2014 | Lei et al. |
| 2015/0139264 A1* | 5/2015 | Zhang ................... H01S 5/1032 372/107 |
| 2015/0207291 A1 | 7/2015 | Rickman et al. |
| 2015/0207296 A1 | 7/2015 | Rickman et al. |
| 2015/0222089 A1* | 8/2015 | Jeong ....................... H01S 5/14 359/346 |
| 2015/0236793 A1* | 8/2015 | Duan .................... H01S 5/0612 398/28 |
| 2015/0303653 A1 | 10/2015 | Tanaka |
| 2016/0025926 A1 | 1/2016 | Taylor |
| 2016/0301477 A1* | 10/2016 | Orcutt .................. H04B 10/801 |
| 2017/0139237 A1 | 5/2017 | Luo et al. |
| 2018/0261983 A1 | 9/2018 | Bovington et al. |
| 2020/0412103 A1 | 12/2020 | Zilkie et al. |
| 2021/0083457 A1 | 3/2021 | Zilkie et al. |
| 2021/0167583 A1 | 6/2021 | Zilkie et al. |
| 2021/0281051 A1 | 9/2021 | Zilkie et al. |
| 2022/0059996 A1 | 2/2022 | Zilkie et al. |

FOREIGN PATENT DOCUMENTS

| | | | |
|---|---|---|---|
| CN | 106104947 A | 11/2016 | |
| EP | 0 310 058 A2 | 4/1989 | |
| EP | 1 300 918 A2 | 4/2003 | |
| EP | 1 761 103 A1 | 3/2007 | |
| EP | 2 544 319 A1 | 1/2013 | |
| JP | S62229105 A * | 10/1987 | ........... H04B 10/506 |
| JP | 2013-93627 A1 | 5/2013 | |
| WO | WO 00/36715 A1 | 6/2000 | |
| WO | WO 02/41663 A2 | 5/2002 | |
| WO | WO 02/079863 A2 | 10/2002 | |
| WO | WO 2010/100489 A1 | 9/2010 | |
| WO | WO 2014/060648 A1 | 4/2014 | |
| WO | WO 2015/060820 A1 | 4/2015 | |

OTHER PUBLICATIONS

Partial Machine English Translation of Chinese Notification of the First Office Action, for Patent Application No. 201880020394.3, mailed Jul. 18, 2022, 6 pages.

Bernasconi, P. et al., "Optical Switch Fabrics for Ultra-High-Capacity IP Routers", Journal of Lightwave Technology, Nov. 2003, pp. 2839-2850, vol. 21, No. 11, IEEE.

Cherchi, M. et al., "Deeply etched MMI-based components on 4 μm thick SOI for SOA-based optical RAM cell circuits", Proceedings of SPIE, 2013, 7 Pages, vol. 8629, No. 86290C-1, International Society for Optical Engineering, United States.

Chinese Notification of the First Office Action, for Patent Application No. CN201580012694.3, mailed Aug. 21, 2018, 14 pages.

Chinese Notification of the Second Office Action, for Patent Application No. CN201580012694.3, mailed Mar. 29, 2019, 3 pages.

Farrington, N. et al., "A Demonstration of Ultra-Low-Latency Data Center Optical Circuit Switching", ACM SIGCOMM Computer Communication Review '12, Aug. 13-17, 2012, pp. 95-96, vol. 42, No. 4.

(56) References Cited

OTHER PUBLICATIONS

Farrington, N. et al., "Helios: A Hybrid Electrical/Optical Switch Architecture for Modular Data Centers", SIGCOMM'10, Aug. 30, 2010 through Sep. 3, 2010, 12 pages, ACM.

Fischer, A.P.A. et al., "Experimental and Theoretical Study of Filtered Optical Feedback in a Semiconductor Laser", IEEE Journal of Quantum Electronics, Mar. 2000, pp. 375-384, vol. 36, No. 3, IEEE.

Fujioka, N. et al., "Compact and Low Power Consumption Hybrid Integrated Wavelength Tunable Laser Module Using Silicon Waveguide Resonators", Journal of Lightwave Technology, Nov. 1, 2010, pp. 3115-3120, vol. 28, No. 21.

Huang, Z. et al., "Four-Wavelength III-V/SOI Heterogeneous Integrated Laser Based on Sampled Bragg Grating for CWDM", IEEE Photonics Journal, Oct. 2013, 7 Pages, vol. 5, No. 5, IEEE Photonics Society Publication.

International Search Report and Written Opinion of the International Searching Authority, Mailed Jul. 14, 2015, Corresponding to PCT/GB2015/050105, 19 pages.

International Search Report and Written Opinion of the International Searching Authority, Mailed Sep. 16, 2015, and, Corresponding to PCT/GB2015/050524, 18 Pages.

International Search Report and Written Opinion of the International Searching Authority, Mailed Sep. 27, 2018, Corresponding to PCT/EP2018/065853, 13 pages.

Jalali, B. et al., "Silicon Photonics", Journal of Lightwave Technology, Dec. 2006, pp. 4600-4615, vol. 24, No. 12.

Kachris, C. et al., "A Survey on Optical Interconnects for Data Centers", IEEE Communications Surveys & Tutorials, Fourth Quarter 2012, pp. 1021-1036, vol. 14, No. 4.

Madsen, C.K., "General IIR Optical Filter Design for WDM Applications Using All-Pass Filters", Journal of Lightwave Technology, Jun. 2000, pp. 860-868, vol. 18, No. 6, IEEE.

Ngo, H.Q et al., "Constructions and Analyses of Nonblocking WDM Switches Based on Arrayed Waveguide Grating and Limited Wavelength Conversion", IEEE/ACM Transactions On Networking, Feb. 2006, pp. 205-217, vol. 14, No. 1.

Ngo, H.Q. et al., "Optical Switching Networks with Minimum Number of Limited Range Wavelength Converters", IEEE, 2005, pp. 1128-1138.

Partial English translation of the Chinese Notification of the First Office Action, for Patent Application No. CN201580012694.3, mailed Aug. 21, 2018, 4 pages.

Partial English translation of the Chinese Notification of the Second Office Action, for Patent Application No. CN201580012694.3, mailed Mar. 29, 2019, 2 pages.

Partial International Search for Patent Application No. PCT/GB2015/050105, Mailed May 4, 2015, 6 Pages.

Proietti, R. et al., "40 GB/s 8x8 Low-latency Optical Switch for Data Centers", OSA/OFC/NFOEC, 2011, 3 Pages.

Proietti, R. et al., "TONAK: A Distributed Low-latency and Scalable Optical Switch Architecture", 39th European Conference and Exhibition on Optical Communication (ECOC), 2013, pp. 1005-1007.

Smith, B.T. et al., "Fundamentals of Silicon Photonic Devices", 2006, 7 Pages.

Solehmainen, K. et al., "Adiabatic and Multimode Interference Couplers on Silicon-on-Insulator", IEEE Photonics Technology Letters, Nov. 1, 2006, 4 pages, vol. 18, No. 21, IEEE.

Tanaka, S. et al., "High-output-power, single-wavelength silicon hybrid laser using precise flip-chip bonding technology", Optics Express, Dec. 4, 2012, pp. 28057-28069, vol. 20, No. 27.

Thomas, S. et al., "Dry etching of horizontal distributed Bragg reflector mirrors for waveguide lasers", Journal of Vacuum Science & Technology B: Microelectronics and Nanometer Structures Processing, Measurement, and Phenomena, Nov. 1996, 6 pages, American Vacuum Society.

Tsao, S. et al., "A Novel MMI-MI SOI Temperature Sensor", IEEE 13th Annual Meeting Lasers and Electro-Optics Society 2000 Annual Meeting, LEOS 2000, 2000, pp. 464-465, vol. 2.

U.K. Intellectual Property Office Examination Report, dated Oct. 21, 2021, for Patent Application No. GB 2000537.7, 3 pages.

U.K. Intellectual Property Office Search Report dated Jul. 31, 2014, for Patent Application No. GB1400909.6, 5 Pages.

U.K. Intellectual Property Office Search Report, Claims 27-52, dated Oct. 20, 2014, for Patent Application No. GB1400909.6, 3 Pages.

U.K. Intellectual Property Office Search Report, Claims 53-69, dated Oct. 20, 2014, for Patent Application No. GB1400909.6, 2 Pages.

U.K. Intellectual Property Office Search Report, Claims 70-72, dated Oct. 20, 2014, for Patent Application No. GB1400909.6, 3 Pages.

U.K. Intellectual Property Office Search Report, dated Nov. 5, 2015 for Patent Application No. GB1400909.6, 5 Pages.

U.S. Advisory Action from U.S. Appl. No. 16/007,896, dated Aug. 1, 2019, 4 pages.

U.S. Notice of Allowance Action from U.S. Appl. No. 16/007,896, dated Jun. 16, 2020, 10 pages.

U.S. Office Action from U.S. Appl. No. 16/007,896, dated Dec. 13, 2019, 20 pages.

U.S. Office Action from U.S. Appl. No. 16/007,896, dated May 9, 2019, 19 pages.

U.S. Office Action from U.S. Appl. No. 16/007,896, dated Nov. 16, 2018, 18 pages.

Website: TL5300 Series LambdaFLEX Micro-iTLA Tunable Laser, Oclaro, Inc., http://www.oclaro.com/product/tl5300-series/, printed Nov. 3, 2015, 3 Pages.

Xi, K. et al., "Petabit Optical Switch for Data Center Networks", Technical Report, Sep. 11, 2010, pp. 1-9, Polytechnic Electrical & Computer Engineering Department, Polytechnic Institute of NYU, Brooklyn, New York. Located at http://eeweb.poly.edu/chao/publications/petasw.pdf.

Xu, D.X. et al., "SOI Photonic Wire Waveguide Ring Resonators Using MMI Couplers", 3rd IEEE International Conference on Group IV Photonics, 2006, pp. 28-30, IEEE.

Ye, T. et al., "A Study of Modular AWGs for Large-Scale Optical Switching Systems", Journal of Lightwave Technology, Jul. 1, 2012, pp. 2125-2133, vol. 30, No. 13.

Ye, T. et al., "AWG-Based Non-Blocking Clos Networks", IEEE/ACM Transactions on Networking, Apr. 2015, pp. 491-504, vol. 23, No. 2.

Zhao, J. et al., "Novel Lasers Using Multimode Interference Reflector", 2011 ICO International Conference on Information Photonics (IP), May 18, 2011, pp. 1-2; IEEE.

Zhao, J. et al., "On-chip Laser with Multimode Interference Reflectors Realized in a Generic Integration Platform", Compound Semiconductor Week (CSW/IPRM), 23rd International Conference on Indium Phosphide and Related Materials, May 22, 2011, pp. 1-4, IEEE.

Zilkie, A.J. et al., "Power-efficient III-V/Silicon external cavity DBR lasers", Optics Express, Sep. 27, 2012, pp. 23456-23462, vol. 20, No. 21.

Partial English Translation of Chinese Notification of the First Office Action, provided by Foreign Associate, for Patent Application No. 201880020394.3, mailed Jul. 18, 2022, 10 pages.

* cited by examiner

BROADBAND ARBITRARY WAVELENGTH MULTICHANNEL LASER SOURCE

CROSS-REFERENCE TO RELATED APPLICATION(S)

The present application is a continuation-in-part of U.S. patent application Ser. No. 17/519,412, filed Nov. 4, 2021, which is a continuation of U.S. patent application Ser. No. 17/327,508, filed May 21, 2021, which is a continuation of U.S. patent application Ser. No. 17/172,033, filed Feb. 9, 2021, which is a continuation of U.S. patent application Ser. No. 17/104,929, filed Nov. 25, 2020, which is a continuation of U.S. patent application Ser. No. 17/022,901, filed Sep. 16, 2020, which is a continuation of U.S. patent application Ser. No. 16/007,896, filed Jun. 13, 2018, now U.S. Pat. No. 10,811,848, issued Oct. 20, 2020, which claims the benefit of U.S. Provisional Application No. 62/519,754, filed Jun. 14, 2017, and claims the benefit of U.S. Provisional Application No. 62/548,917, filed Aug. 22, 2017; the entire contents of all of the applications identified in this paragraph are incorporated herein by reference.

FIELD

One or more aspects of embodiments according to the present disclosure relate to light sources, and more particularly to a multichannel light source.

BACKGROUND

Some systems may use a silicon photonics integrated multichannel tunable laser source which has arbitrary wavelength channels covering a wavelength span of multiple hundreds to one or more thousands of nanometers, a span which is much larger than the gain bandwidth of a single reflective semiconductor optical amplifier (RSOA) die, or RSOA "chip".

Such a laser source may be constructed using a single laser cavity for each channel, with, e.g., each laser constructed according to U.S. Pat. No. 9,270,078 (the "'078 patent"), which is incorporated herein by reference in its entirety. The channels may be combined externally to the cavity using a channel combiner such as an optical multiplexer (MUX), or additional ring resonator tunable filters. The use of a MUX external to the laser cavities for combining may have the disadvantages of (i) imposing a minimum channel spacing due to the periodicity of the passband response, (ii) introducing stop-bands where channels cannot exist, and (iii) for small channel spacing (and a large number of channels), incurring relatively high MUX losses. In an embodiment with multiple MUXs of different designs and channel spacings connected to one or more additional MUX to combine the outputs of the multiple MUXs to one common output, the optical loss may also be relatively high.

Ring resonator tunable filters may be used to combine the light from multiple lasers externally to the laser cavities, but such an embodiment includes further ring resonator tunable filters in addition to the ones used inside each laser cavity. As a result, more tunable elements may be included, requiring more stabilization circuits. Moreover, locking the external filter wavelength to the internal laser filter wavelength may increase the complexity of the system.

Thus, there is a need for an improved multichannel laser source.

SUMMARY

According to an embodiment of the present disclosure, there is provided a multi-channel laser source, including: a bus waveguide coupled, at an output end of the bus waveguide, to an output of the multi-channel laser source; a first semiconductor optical amplifier; a first back mirror; a first wavelength-dependent coupler having a first resonant wavelength; a second semiconductor optical amplifier; a second back mirror; a second wavelength-dependent coupler having a second resonant wavelength, different from the first resonant wavelength; and an output mirror at the output end of the bus waveguide, the first semiconductor optical amplifier including: a first end coupled to the first back mirror, and a second end, the first wavelength-dependent coupler including: a channel port connected to the second end of the first semiconductor optical amplifier; a bus output connected to a first portion of the bus waveguide; and a bus input, connected to a second portion of the bus waveguide more distant from the output end of the bus waveguide than the first portion of the bus waveguide; the second semiconductor optical amplifier being coupled to the bus waveguide through the second wavelength-dependent coupler, the first wavelength-dependent coupler being nearer to the output end of the bus waveguide than the second wavelength-dependent coupler, the first wavelength-dependent coupler being configured to transmit light, at the second resonant wavelength, from the bus input of the first wavelength-dependent coupler to the bus output of the first wavelength-dependent coupler, and the output mirror having a first reflectance at the first resonant wavelength and a second reflectance at the second resonant wavelength, the first reflectance differing from the second reflectance by no more than 10%.

In some embodiments, the output mirror has a reflectance that is constant, over a wavelength range spanning 150 nm, to 10%.

In some embodiments, the output mirror has a reflectance that is constant, over a wavelength range spanning 500 nm, to 10%.

In some embodiments, the output mirror has a reflectance that is constant, over a wavelength range spanning 1000 nm, to 10%.

In some embodiments: the output mirror includes a transverse slot in the bus waveguide, the transverse slot extends at least half-way through the total height of the bus waveguide, the transverse slot is tapered, and a facet on a side of the transverse slot nearer the output of the multi-channel laser source is oblique to the bus waveguide at the output mirror.

In some embodiments, the output mirror includes a directional coupler and a waveguide loop.

In some embodiments, the output mirror is at an edge of a silicon photonics chip and the output mirror is configured to launch light into free space.

In some embodiments, the output mirror includes a chirped distributed Bragg reflector.

In some embodiments: the first wavelength-dependent coupler is configured: to reflect a first portion of light received at the first resonant wavelength at the channel port of the first wavelength-dependent coupler, and to transmit, to the bus output of the first wavelength-dependent coupler, a second portion of light received at the first resonant wavelength at the channel port of the first wavelength-dependent coupler; the first portion is at least 10% of the light received; and the second portion is at least 40% of the light received.

In some embodiments, the first wavelength-dependent coupler includes a first ring resonator and a second ring resonator, the first ring resonator and the second ring resonator being configured to operate as a vernier ring resonator filter.

In some embodiments, wherein the first wavelength-dependent coupler includes a grating assisted co-directional coupler.

In some embodiments, wherein the first wavelength-dependent coupler further includes a distributed Bragg reflector connected in cascade with the grating assisted co-directional coupler.

In some embodiments, the first wavelength-dependent coupler includes a wavelength actuator for adjusting the first resonant wavelength.

In some embodiments, the multi-channel laser source further includes an amplitude modulator between the first back mirror and the first wavelength-dependent coupler.

In some embodiments, the first semiconductor optical amplifier is the same semiconductor optical amplifier as the second semiconductor optical amplifier.

In some embodiments, the first semiconductor optical amplifier includes a first waveguide in a first semiconductor chip and the second semiconductor optical amplifier includes a second waveguide in the first semiconductor chip.

In some embodiments, the first semiconductor optical amplifier includes a waveguide in a first semiconductor chip, and the second semiconductor optical amplifier includes a waveguide in a second semiconductor chip, different from the first semiconductor chip.

In some embodiments, the multi-channel laser source further includes: a wavelength sensor configured to receive a portion of, and to sense a wavelength of, light emitted by the first semiconductor optical amplifier; and a control system configured: to receive a wavelength sensing signal from the wavelength sensor, to calculate a difference between the wavelength sensing signal and a wavelength setpoint, and to apply a wavelength correction signal to a wavelength actuator, to reduce the difference between the wavelength sensing signal and the wavelength setpoint, wherein: the first wavelength-dependent coupler includes a coupler wavelength actuator for adjusting the first resonant wavelength, the wavelength actuator includes the coupler wavelength actuator, and the wavelength sensor is configured to receive light from a fourth port of the first wavelength-dependent coupler.

In some embodiments: the first semiconductor optical amplifier includes a waveguide in a first semiconductor chip; and the wavelength sensor includes a photodiode, the photodiode being in the first semiconductor chip.

According to an embodiment of the present disclosure, there is provided a multiplexed multi-channel laser source including: a first multi-channel laser, a second first multi-channel laser source, and a multiplexer, the multiplexer including: a first input, a second input, and an output, the multiplexer being configured: to transmit light from first input to the output, and to transmit light from second input to the output.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a multichannel laser source provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
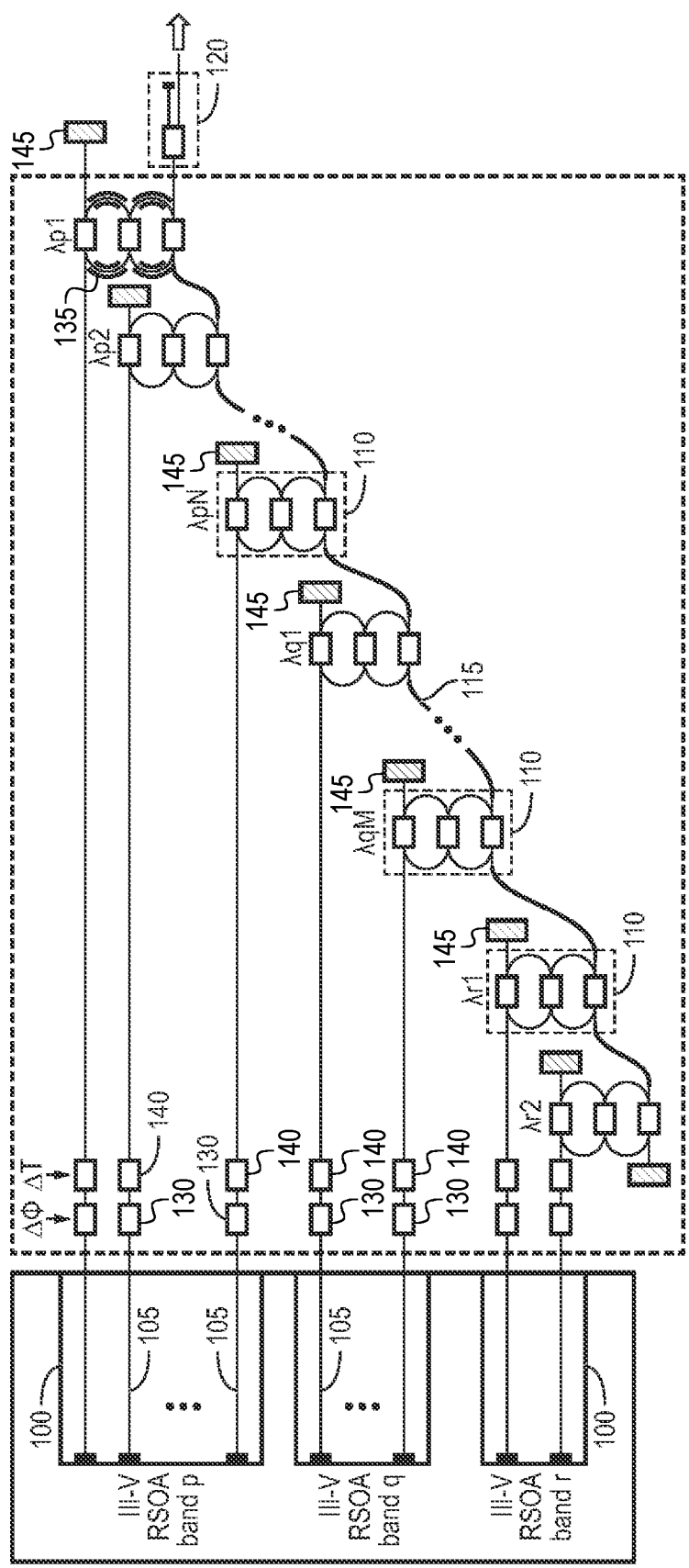
FIG. 1A is a schematic illustration of a multichannel laser, according to an embodiment of the present invention.

Referring to FIG. 1A, in a first embodiment, multiple RSOAs 100 of different band-gaps and material compositions are integrated to construct a multichannel tunable laser. Each RSOA may be fabricated in a GaAs, InP or GaSb system. RSOAs fabricated in a GaAs system may include, for example, (i) AlGaAs or InGaAs quantum wells or (ii) InAs quantum dots, grown in AlGaAs or InGaAs barrier layers on a GaAs substrate. RSOAs fabricated in an InP system may include, for example, (i) InGaAs, InAlGaAs or InGaAsP quantum wells, or (ii) InAs quantum dots, grown in InGaAsP barrier layers on an InP substrate. RSOAs fabricated in a GaSb system may include, for example GaInAsSb quantum wells in AlGaAsSb barrier layers on a GaSb substrate. Each RSOA provides optical gain to one or more of a plurality of laser channels, each generating light at a respective wavelength, and all channels are combined into a single output waveguide, or "bus waveguide" 115. In this embodiment, a single vernier ring resonator tunable filter set (or simply "vernier ring resonator filter") is employed, for each channel, to perform gain selection inside the laser cavity to select the lasing wavelength, and to combine the lasing light with that of other channels into the single bus waveguide 115, all inside a laser cavity having a shared output coupler (or "output mirror") 120.

Each vernier ring resonator filter operates as a wavelength-dependent coupler, as discussed in further detail below. Only one vernier ring resonator filter is needed for each channel, and as many channels can be added as desired, at the expense of making the laser cavity longer. Each RSOA chip may be separately fabricated (e.g., out of a III-V semiconductor material) and aligned with (and bonded to) a silicon photonics chip (which may be fabricated on a silicon-on-insulator (SOI) wafer) which includes the other optical components shown (e.g., the vernier ring resonator filters 110, the bus waveguide 115, and the output coupler 120). The silicon on insulator wafer may include a buried oxide (BOX) layer on a silicon substrate, and a silicon device layer (which may be used to form the waveguides described herein) on the buried oxide layer. The buried oxide layer may have an index of refraction that is less than that of silicon, and may therefore act as a cladding layer for the waveguide.

Figure 1B:
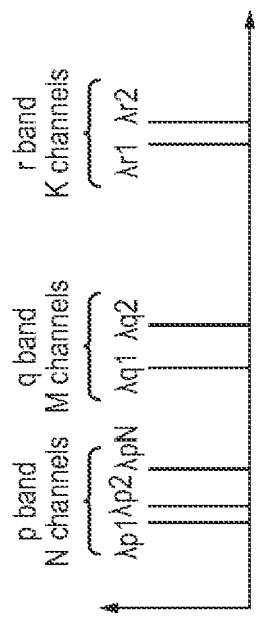
FIG. 1B is a schematic illustration of an optical spectrum, according to an embodiment of the present invention.

The reflective surface of the RSOA may operate as the back mirror of the laser cavity. In some embodiments, the back mirror is a separate element from the semiconductor optical amplifier. FIG. 1B shows an example of an optical spectrum that may be generated by the embodiment of FIG. 1A. A fourth port of each vernier ring resonator filter may be connected to an optical absorber 145 (or used for wavelength sensing), as discussed in further detail below. The multichannel laser source may include RSOAs fabricated of different materials, and the range of wavelengths over which the multichannel laser source generates light may span 150 nm or more, between 1.2 microns and 3.0 microns. In some embodiments, the range of wavelengths over which the multichannel laser source generates spans more than 500 nm, e.g., it may span 1000 nm or the entire range from 1.2 microns and 3.0 microns.

Figure 2A:
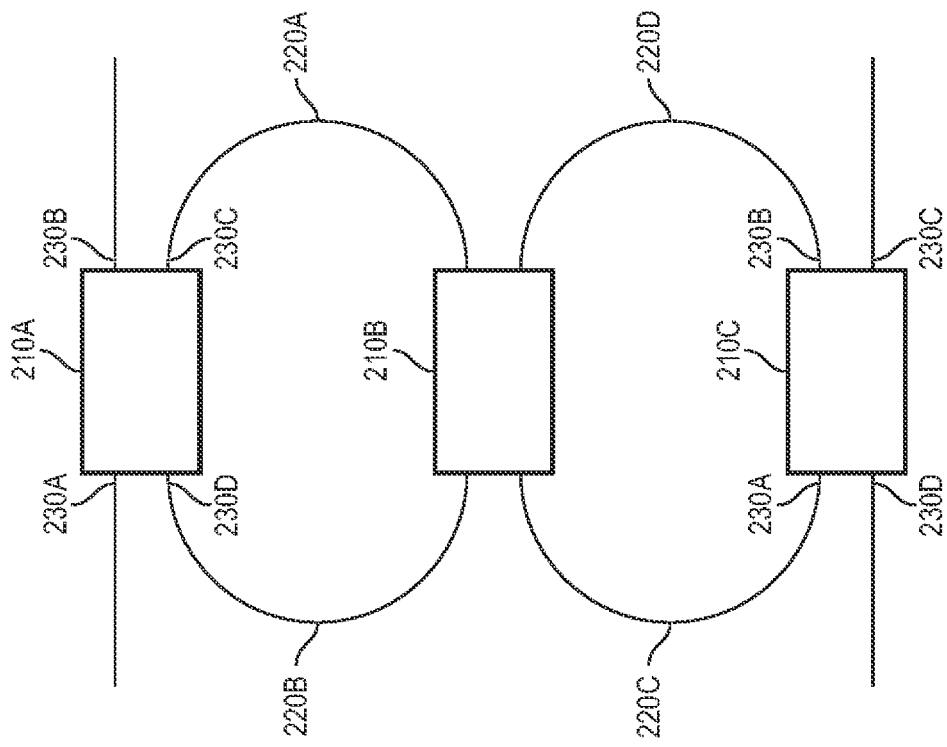
FIG. 2A is a schematic illustration of a vernier ring resonator filter, according to an embodiment of the present invention.

Referring to FIG. 2A, in some embodiments, each vernier ring resonator filter is a four-port device including three multimode interference couplers (MMIs) 210A-C, connected together with waveguide paths referred to as ring-halves 220A-220D. Each MMI has four ports that may be referred to as an input port 230A, an output port 230B, a coupled port 230C, and an isolated port 230D. The ratio of (i) power transmitted to the coupled port to (ii) power supplied to the input port may be referred to as the coupling factor. If the output port 230B is defined to be the port opposite the input port 230A, as in FIG. 2A, then the coupling factor may also be referred to as the "cross coupling" and the ratio of (i) the power transmitted to the coupled port to (ii) power supplied to the input port may be referred to as the "bar coupling" (the terminology employed in the '078 patent). The input port and the isolated port may be referred to (e.g., in the '078 patent) as "back end" ports and the output port and the coupled port may be referred to (e.g., in the '078 patent) as "front end" ports. Other examples of vernier ring resonator filters are disclosed in the '078 patent.

Each pair of ring-halves forms, with two respective MMIs, a closed optical path that may be referred to as a ring resonator (or as a "simple" or "single" resonator, to distinguish it from a vernier ring resonator filter, which may include two or more (coupled) simple ring resonators). Light may be coupled into or out of this closed optical path through the MMIs. For example, for a first resonator including the first MMI 210A, the first and second ring halves 220A, 220B, and the second MMI 210B, light propagating in the forward direction (from the RSOA to the output coupler) may enter the input port 230A of the first MMI 210A, and propagate around a first ring, formed by the first and second ring halves 220A, 220B and the first and second MMIs 210A, 210B. A portion of the light propagating around this ring may be coupled out of the first ring and into a second ring formed by the third and fourth ring halves 220C, 220D and the second and third MMIs 210B, 210C. At a wavelength for which the round-trip phase around the closed path is a multiple of 2π, the ring resonator may be said to be resonant, and light coupled into the ring resonator interferes constructively with light circulating in the ring resonator, resulting in greater circulating power than is the case for wavelengths at which the ring resonator is not resonant. The wavelength (or frequency) separation between consecutive resonant wavelengths of the ring resonator is referred to as the free spectral range (FSR) of the ring resonator. The second ring resonator, formed by the third and fourth ring halves 220C, 220D and the second and third MMIs 210B, 210C, may operate in a similar manner.

Figure 2B:
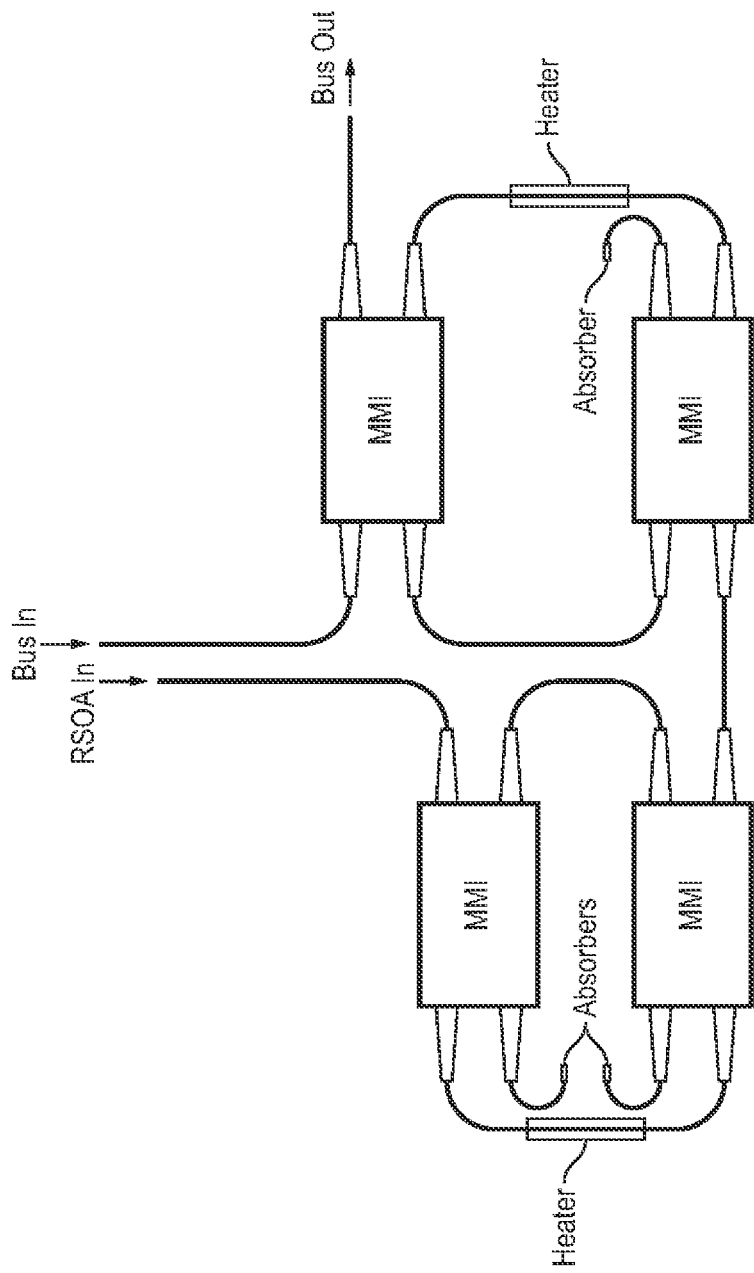
FIG. 2B is a schematic illustration of a vernier ring resonator filter, according to an embodiment of the present invention.
Figure 2C:
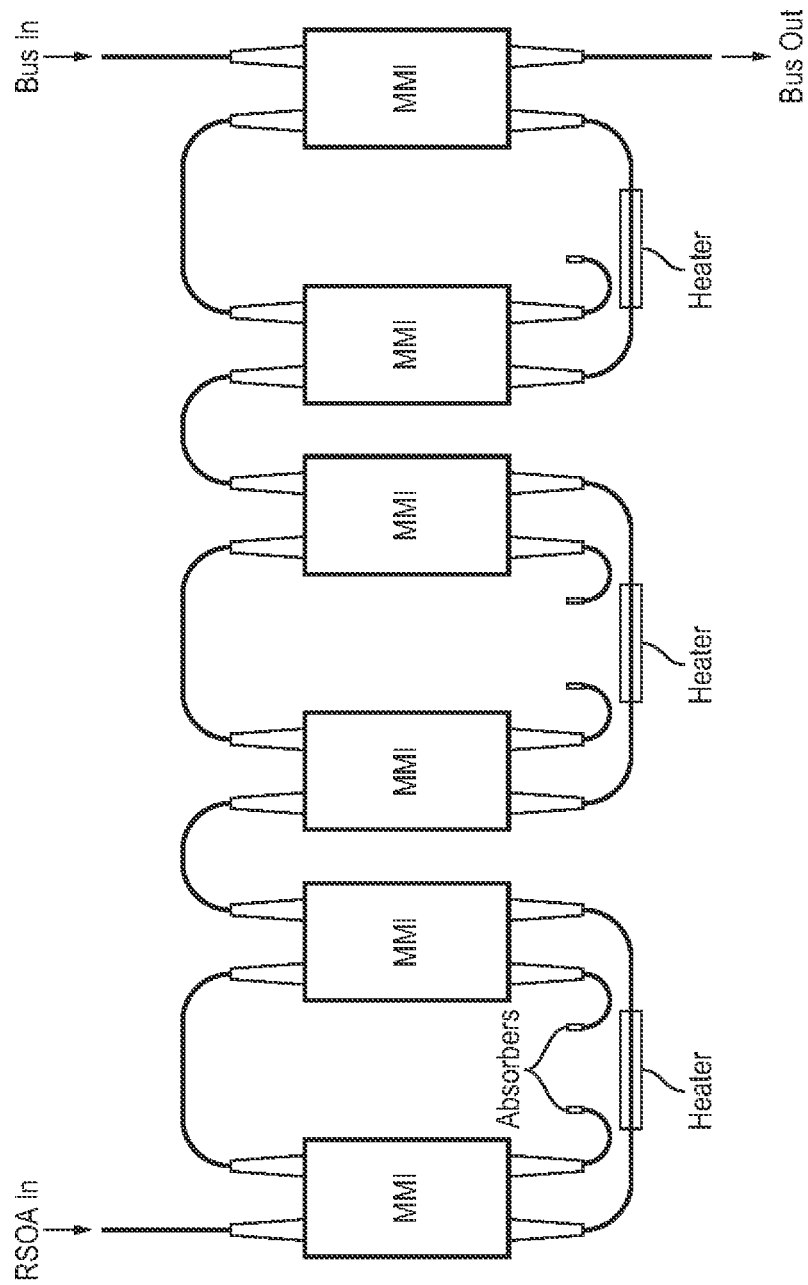
FIG. 2C is a schematic illustration of a vernier ring resonator filter, according to an embodiment of the present invention.

The vernier ring resonator filter (which includes the first ring resonator and the second ring resonator) may, as mentioned above, act as a wavelength-dependent coupler, with (for example, for forward travelling light) the input port 230A of the first MMI 210A being the input port of the vernier ring resonator filter, and the coupled port 230C of the third MMI 210C being the coupled port of the vernier ring resonator filter. At a wavelength at which both the first resonator and the second resonator are resonant, the vernier ring resonator filter is resonant, and the coupling ratio of the vernier ring resonator filter is high. The vernier ring resonator filter may be a reciprocal device, so that when it is resonant, light returning, on the bus waveguide 115, from the output coupler 120, may be coupled, through the vernier ring resonator filter 110, back to the RSOA. When a resonant wavelength of the first vernier ring resonator filter is nearly equal to a resonant wavelength of the second vernier ring resonator filter, the vernier ring resonator filter may be resonant at a wavelength that is between the two wavelengths. When the vernier ring resonator filter is not resonant, the coupling ratio of the vernier ring resonator filter is low. The first ring resonator and the second ring resonator may have slightly different free spectral ranges, so that the wavelengths at which the vernier ring resonator filter is resonant are relatively widely separated, and so that only one wavelength at which the vernier ring resonator filter is resonant falls within the gain bandwidth of the RSOA. This (relatively wide) separation between consecutive resonant wavelengths of the vernier ring resonator filter may be referred to as the free spectral range (FSR) of the vernier ring resonator filter. The width of a resonant peak of the vernier ring resonator filter (e.g., the wavelength range over which the coupling ratio is within 3 dB of the maximum coupling ratio in the peak) may be referred to as the "bandwidth" of the vernier ring resonator filter, and it may be expressed in units of wavelength or frequency. In some embodiments, a two-ring vernier ring resonator filter such as that of FIG. 2B, or a three-ring vernier ring resonator filter such as that of FIG. 2C, may be used instead of the two-ring vernier ring resonator filter of FIG. 2A in the embodiment of FIG. 1A (or in the embodiments of FIGS. 3A, 4, and 5, discussed below). The resonant wavelength of a vernier ring resonator filter may be tuned using phase shifters 135 (FIG. 1A) which may use heaters, as shown for example in FIGS. 2B and 2C, or which may use p-n or p-i-n junctions, as described, for example, in the '078 patent. In some embodiments each of the MMIs shown in FIGS. 2A-2C has a cross coupling ratio equal to its bar coupling ratio.

Referring again to FIG. 1A, a plurality of vernier ring resonator filters 110 according to FIG. 2A (or alternate embodiments of the vernier resonator, such as those disclosed in the the '078 patent) may be used to couple a respective plurality of RSOAs to a bus waveguide, at the output end of which a broadband partially reflective element acts as the output coupler 120 for all of the channels. Each RSOA chip 100 may provide optical gain in a respective wavelength band. The RSOA chips 100 may include different respective epitaxial ("epi") designs or material systems, and have different respective gain spectrum center wavelengths, spanning, together, a large spectral range. The number of channels and the bandwidth in each band may be limited by the gain bandwidth of the RSOA chip 100 for that band. Each RSOA chip may include an array of RSOAs 105, each RSOA 105 being formed as a separate waveguide in the RSOA chip 100, and each providing optical gain for a respective one of the channels using the RSOA chip 100. As used herein, a "band" or "wavelength band" refers to a range of wavelengths over which an RSOA chip has appreciable gain.

In some embodiments, each channel includes a phase shifter 130 ($\Delta\varphi$) and an amplitude modulator 140 ($\Delta T$). Phase shifters 130 may be included to enable accurate control of lasing wavelengths, and amplitude modulators 140 may be included to enable modulation of the laser power. The bandwidth over which amplitude modulation inside the laser cavity may be performed is inversely proportional to the cavity length. In some embodiments, amplitude modulation at rates of a few kHz, or a few MHz, may be used for channel identification or for homodyne/heterodyne detection at a receiver; modulation at GHz frequencies may be impractical, in some embodiments, because of the length of the cavity.

In some embodiments, as an alternative to the use of amplitude modulators, the RSOA bias is modulated with the desired amplitude modulation pattern. This eliminates the need for separate amplitude modulators inside the laser cavity which add loss, but increases the complexity of the RSOA drive circuitry. The length of the laser cavity may be roughly the same for all channels, and increases for all channels as more channels are added. The cavity length may be selected so that the wavelength separation between cavity modes (the free spectral range of the cavity) is greater than the bandwidth of any of the vernier ring resonator filters, so that only one mode at a time will lase in any channel. For example, for a cavity free spectral range of 10 picometers (pm), a cavity length of about 5 cm may be used; this cavity length may accommodate 100 channels or more.

The output coupler 120 may, for example, be implemented with a 1×2 power splitter with a broadband high reflector on one output arm, where the split ratio of the 1×2 power splitter determines the reflectance of the output mirror, and where the splitter is implemented with a broadband MMI or a directional coupler, and the broadband high reflector is implemented with a metal coating, or a Sagnac loop. The total spectral span of the multichannel laser may ultimately be limited by the characteristics of the broadband MMI or coupler used in the output mirror. In some embodiments, the broadband output mirror is implemented with an advanced thin film coating integrated in the output waveguide, or with a broadband (e.g., chirped) DBR grating included in the output waveguide.

Figure 2D:
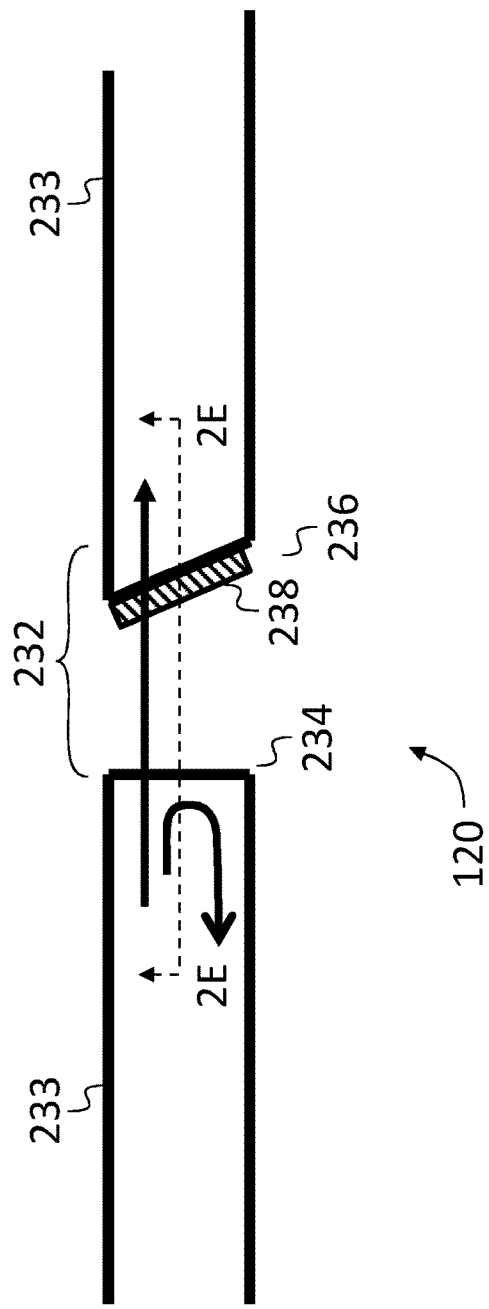
FIG. 2D is a top view of a waveguide having a slot, according to an embodiment of the present invention.
Figure 2E:
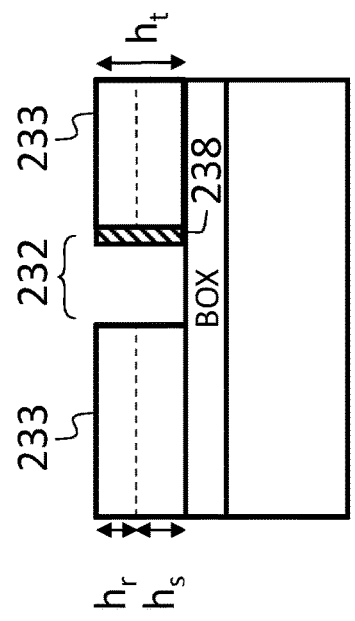
FIG. 2E is a cross-sectional view, along the line 2E-2E, of the embodiment of FIG. 2D, according to an embodiment of the present invention.
Figure 2F:
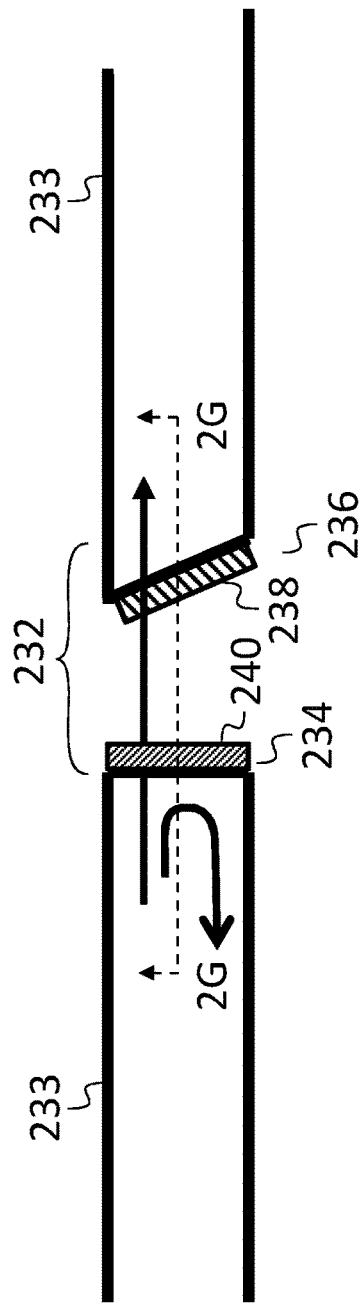
FIG. 2F is a top view of a waveguide having a slot, according to an embodiment of the present invention.
Figure 2G:
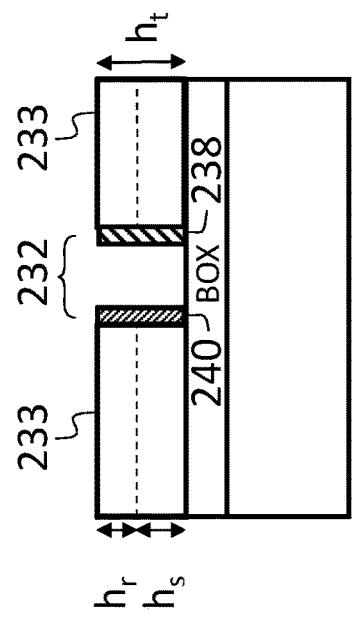
FIG. 2G is a cross-sectional view, along the line 2G-2G, of the embodiment of FIG. 2F, according to an embodiment of the present invention.
Figure 2H:
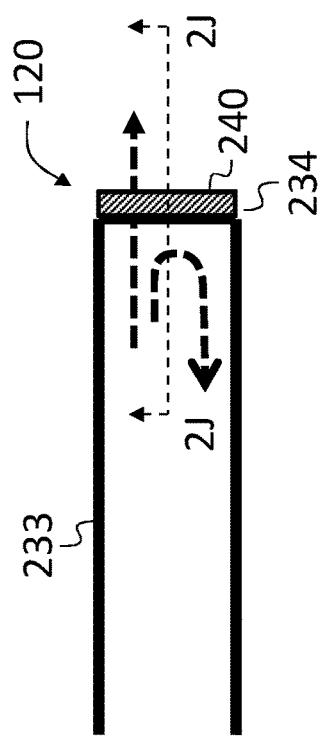
FIG. 2H is a top view of an output coupler, according to an embodiment of the present invention.
Figure 2I:
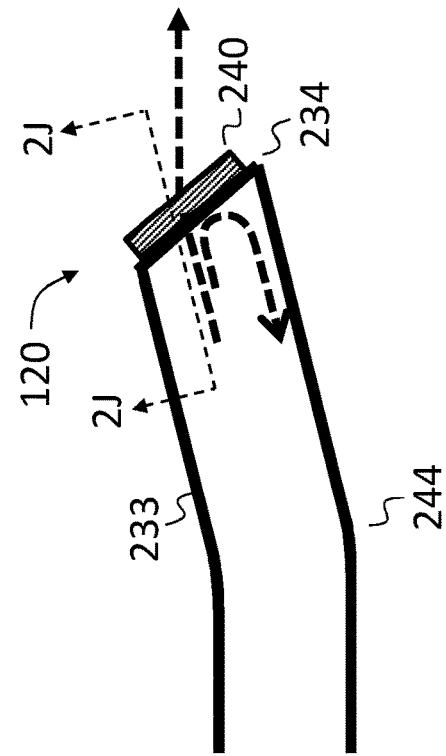
FIG. 2I is a top view of an output coupler, according to an embodiment of the present invention.
Figure 2J:
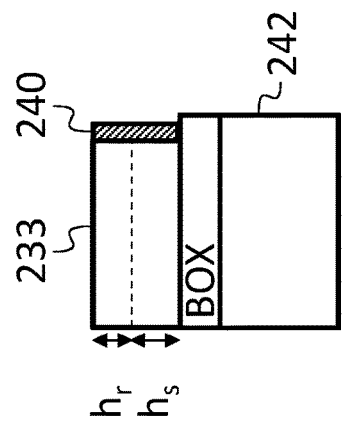
FIG. 2J is a cross-sectional view, along the line 2J-2J, of the embodiment of FIG. 2H or FIG. 2I, according to an embodiment of the present invention.
Figure 2K:
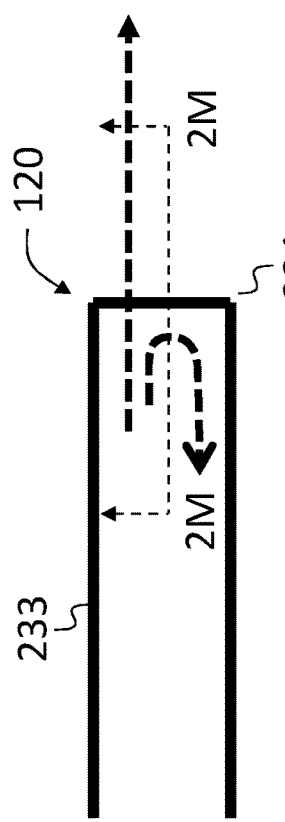
FIG. 2K is a top view of an output coupler, according to an embodiment of the present invention.
Figure 2L:
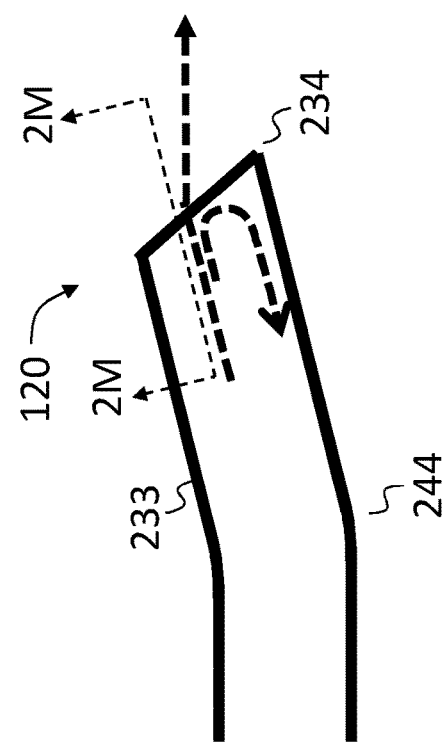
FIG. 2L is a top view of an output coupler, according to an embodiment of the present invention.
Figure 2M:
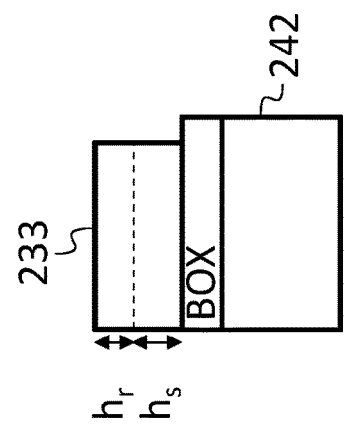
FIG. 2M is a cross-sectional view, along the line 2M-2M, of the embodiment of FIG. 2K or FIG. 2L, according to an embodiment of the present invention.
Figure 2N:
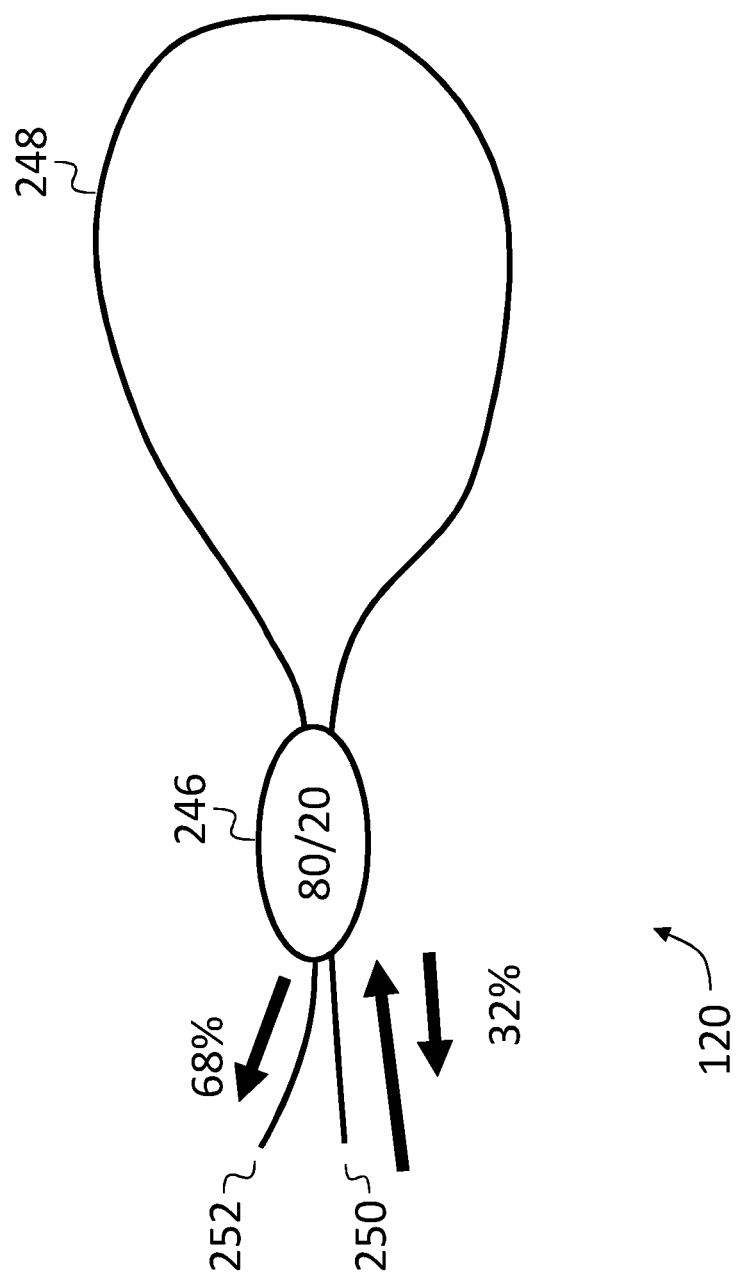
FIG. 2N is a top view of an output coupler, according to an embodiment of the present invention.
Figure 2O:
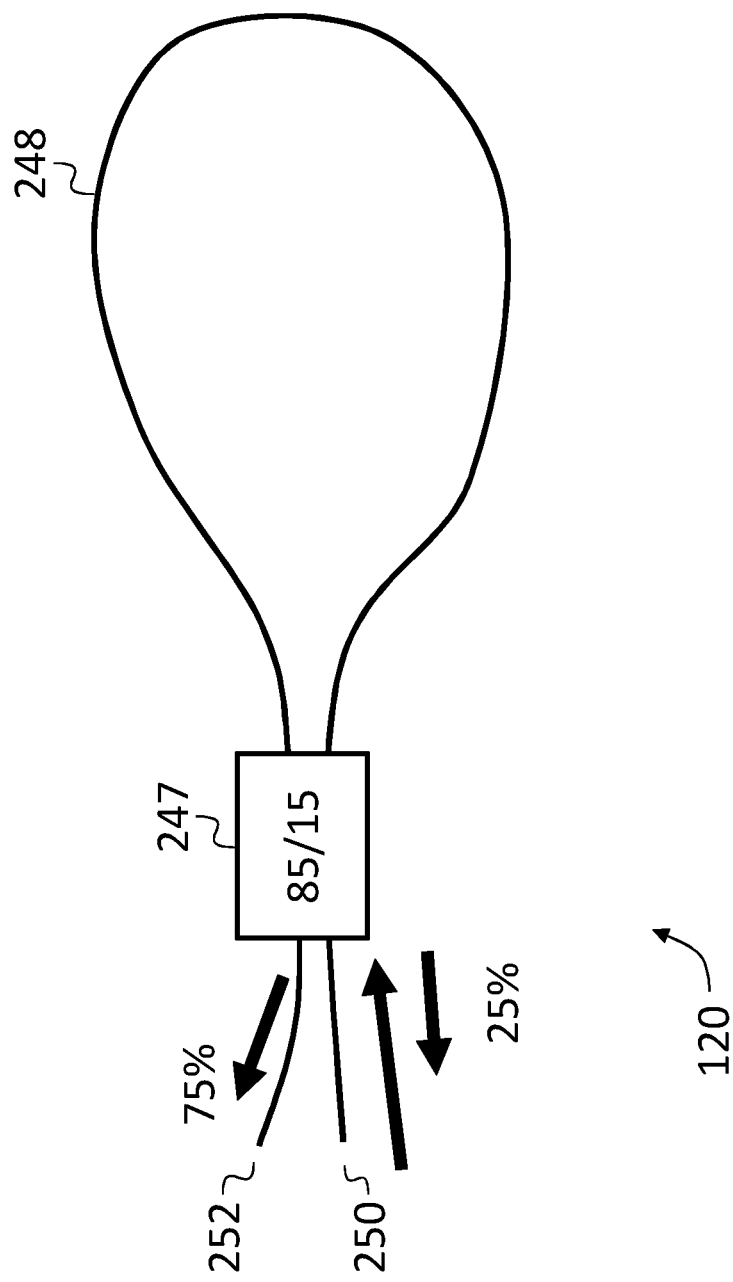
FIG. 2O is a top view of an output coupler, according to an embodiment of the present invention.
Figure 2P:
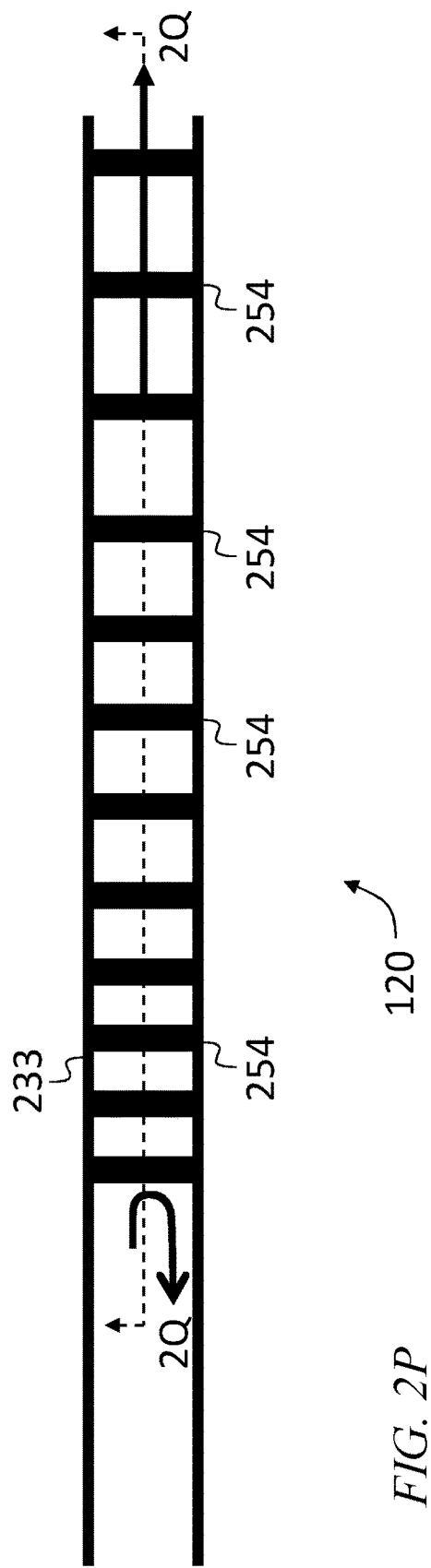
FIG. 2P is a top view of a chirped DBR, according to an embodiment of the present invention.
Figure 2Q:
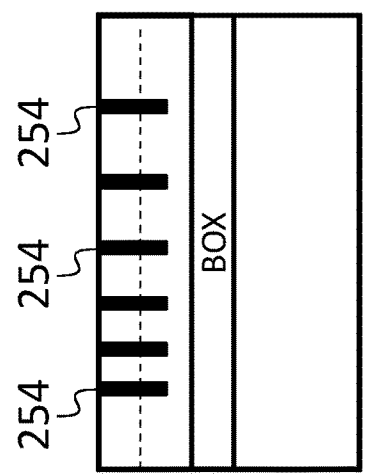
FIG. 2Q is a cross-sectional view, along the line 2Q-2Q, of the embodiment of FIG. 2P, according to an embodiment of the present invention.

In some embodiments, the output coupler 120 may be constructed using a transverse slot in a waveguide, a loop mirror, or a chirped DBR grating, as shown in FIGS. 2D-2Q. Referring to FIGS. 2D and 2E, in some embodiments a slot 232 in a rib or strip waveguide 233 (e.g., a tapered transverse slot, as shown) may be used as a broadband reflector. At the slot 232, a first waveguide end or "facet" 234 may be square, and a second waveguide end or "facet" 236 may be angled, i.e., oblique to the waveguide, as shown. The first waveguide end may be on the laser cavity side of the output coupler 120 and the second waveguide end 236 may be on the output side of the output coupler 120. In operation, the discontinuity in refractive index at the first waveguide end 234 may cause light to be reflected back into the laser cavity. The oblique angle of the second waveguide end 236 may prevent reflections from the second waveguide end 236 from coupling back into the laser cavity. A dielectric thin film anti-reflection coating 238 may be formed on the second waveguide end 236 to reduce loss. The slot 232 may be filled with air or with a transparent material having an index of refraction less than that of silicon (which may have an index of refraction of about 3.5 in the wavelength range of interest)

and greater than that of air; the presence of such a material may reduce the reflectance of the output coupler 120. The reflectance of the first waveguide end 234 may be between about 30% (if the slot 232 is filled with air) and about 15% (for a case in which the slot 232 is filled with a material having an index of refraction less than that of silicon and greater than that of air). The width of the slot 232 (i.e., the separation between the two waveguide ends) may be between 0.5 microns and 10 microns (e.g., between 2 microns and 4 microns) and the angle of the angled facet (i.e., the angle between a normal vector of the waveguide facet and the waveguide) may be between 6 degrees and 20 degrees (e.g., between 6 degrees and 12 degrees or between 6 degrees and 15 degrees).

Referring to FIGS. 2F and 2G, in some embodiments, the first waveguide end 234 may have a coating 240 that may be a single or multi-layer thin film dielectric coating, or a metal coating, to adjust the reflectance of the output coupler 120 over a larger range of values, e.g. down to 5% (for a suitable multi-layer dielectric coating) or up to more than 30% (for a metal coating). The metal coating may be sufficiently thin that the thickness (e.g., a few nanometers) is less than the skin depth in the metal at optical frequencies, such that a fraction of the incident light may be transmitted through the metal layer, and the thickness may be adjusted to produce the desired reflectance. Such a layer may be deposited, for example, with atomic layer deposition (ALD). The slot may be formed by etching, e.g., in the same fabrication steps used to form the waveguide, or in preceding or subsequent etching steps. The slot may extend all the way through the waveguide (e.g., all the way through the device layer of the silicon on insulator wafer) to the cladding layer (e.g., the buried oxide layer), or it may extend part-way down to the buried oxide layer, with the reflectance of the resulting output coupler 120 generally being lower, the less deeply the slot is etched. In some embodiments, the slot extends through at least half the total height ($h_t$) of the waveguide; in some embodiments it extends through a fraction between 20.0% and 100.0% of the height of the waveguide. The waveguide may have a total height equal to the thickness (e.g., 3 microns) of the device layer. In the case of a rib waveguide, the total height may include the height ($h_g$) of the slab and the height ($h_r$) of the rib; in the case of a strip waveguide, the slab may be absent (or sufficiently thin to have little effect on the optical characteristics of the waveguide).

In some embodiments, the portion of the waveguide that is to the right of the slot 232 is removed from the embodiments of FIGS. 2D and 2F, and the output coupler 120 is, as a result, configured to launch light into free space. FIGS. 2H-2M show such embodiments, with (i) a waveguide facet that is perpendicular to the waveguide in the embodiments of FIGS. 2H and 2K, and that is oblique to the waveguide in the embodiments of FIGS. 2I and 2L and (ii) a coating 240 on the waveguide facet in the embodiments of FIGS. 2H-2J, and no coating on the waveguide facet in the embodiments of FIGS. 2K-2M. Any of the embodiments of FIGS. 2H-2M may include a waveguide bend 244 that (together with the facet angle, in the embodiments of FIGS. 2I and 2L) controls the direction of the launched light, e.g., with respect to the edge of the silicon photonics chip (so that, for example, even if the waveguide facet is oblique to the waveguide, the light may be launched in a direction parallel to the portion of the waveguide preceding the bend 244). FIG. 2J is a cross-sectional view, along the line 2J-2J, of the embodiment of FIG. 2H or the embodiment of FIG. 2I, and FIG. 2M is a cross-sectional view, along the line 2M-2M, of the embodiment of FIG. 2K or the embodiment of FIG. 2L. The output coupler may be positioned at the edge 242 of the silicon photonics chip so that the light is launched in a direction away from the edge of the chip. In the embodiments of FIGS. 2I and 2L, the angle between the waveguide facet and a plane perpendicular to the waveguide (or, equivalently, the angle between a normal vector of the waveguide facet and the waveguide) may be between 0.1 degrees and 10.0 degrees. FIGS. 2I and 2L are not drawn to scale, and, for example, the angle of the facet (the angle between a normal vector of the waveguide facet and the waveguide) is exaggerated so as to be more readily perceptible. The facet angle or, in the embodiment of FIG. 2I, the design of the coating, may be selected so as to adjust the reflectance as a function of wavelength, e.g., over a wide bandwidth.

Referring to FIG. 2N, in some embodiments, the output coupler 120 is constructed of a 2×2 directional coupler 246 and a waveguide loop 248 as shown. The directional coupler may include two substantially parallel waveguides sufficiently close together, within a coupling region, that the evanescent waves of their respective modes overlap, enabling light to couple from one waveguide to the other. The bandwidth of an output coupler 120 fabricated in this manner (e.g., the range of wavelengths over which the reflectance is constant to, e.g., 10%) may be made large by using two waveguides that are sufficiently far apart that the coupling between them is weak, and using a coupling region length selected to achieve the desired coupling ratio. The separation between the waveguides in the coupling region may be between 250 nm and 3 microns (e.g., between 0.5 microns and 3 microns) and the length of the coupling region may be between 0 and 50 microns. In a coupler with a coupling region length of 0 microns one or both waveguides may be curved in the coupling region so that the separation is equal to the minimum separation only at one point. The output coupler 120 may have two ports, e.g., a first port 250 and a second port 252, each being a respective waveguide extending from the output coupler 120. One of these ports may be connected to the laser cavity, and the other may form the output of the multichannel laser source. For a lossless output coupler 120, the reflectance may be calculated as $4*t^2*k^2$ where t is the square root of the (power) transmission coefficient of the coupler and k is the square root of the (power) coupling ratio of the coupler (e.g., 20%, or 0.2, for the 80/20 directional coupler shown in FIG. 2H), and the transmittance may be calculated as $t^4+k^4-2*t^2*k^2$.

In some embodiments, an output coupler 120 is constructed with a multimode interference coupler (MMI) 247 substituted for the directional coupler 246 of the embodiment of FIG. 2N; an example of such an output coupler 120 is illustrated in FIG. 2O, for an 85/15 MMI. Like the output coupler 120 of FIG. 2N, the output coupler 120 of FIG. 2O may have two ports, e.g., a first port 250 and a second port 252, each being a respective waveguide extending from the output coupler 120, one of which may be connected to the laser cavity, and the other of which may form the output of the multichannel laser source. Also, as in the case of the output coupler 120 of FIG. 2N, if the output coupler 120 is lossless, the reflectance may be calculated as $4*t^2*k^2$ where t is the square root of the (power) transmission coefficient of the coupler and k is the square root of the (power) coupling ratio of the coupler (e.g., 15%, or 0.15, for the 85/15 MMI 247 shown in FIG. 2O), and the transmittance may be calculated as $t^4+k^4-2*t^2*k^2$. The output coupler 120 of FIG. 2O may be more compact than the output coupler 120 of FIG. 2N, but it may have a smaller bandwidth. For example, the bandwidth of an output coupler 120 according to FIG. 2O (e.g., the range of wavelengths over which the reflectance is constant to, e.g., 10%) may be about 150 nm.

In some embodiments, the output coupler 120 is constructed as a chirped DBR, as shown in FIG. 2P. The chirped DBR may include a plurality of grooves or slots 254 in the waveguide, and it may be "chirped" in the sense that the separation between adjacent slots may increase, or decrease, along the length of the waveguide. An output coupler 120 with the desired reflectance and with a bandwidth greater than 150 nm may be constructed using suitably selected grating length, chirp rate, and etch depth. FIGS. 2P and 2Q are schematic, and are not intended to show the number of slots that would be employed, nor are they drawn to scale. The pitch of the grating may be between 200 nm and 400 nm, the length of the grating may be between 100 microns and 10 mm (e.g., between 1 mm and 10 mm), and the depth of the grooves may be between 100 nm and 300 nm (e.g., 200 nm). FIG. 2Q is not drawn to scale; in some embodiments the grooves are significantly less deep than those illustrated in FIG. 2Q.

Figure 2R:
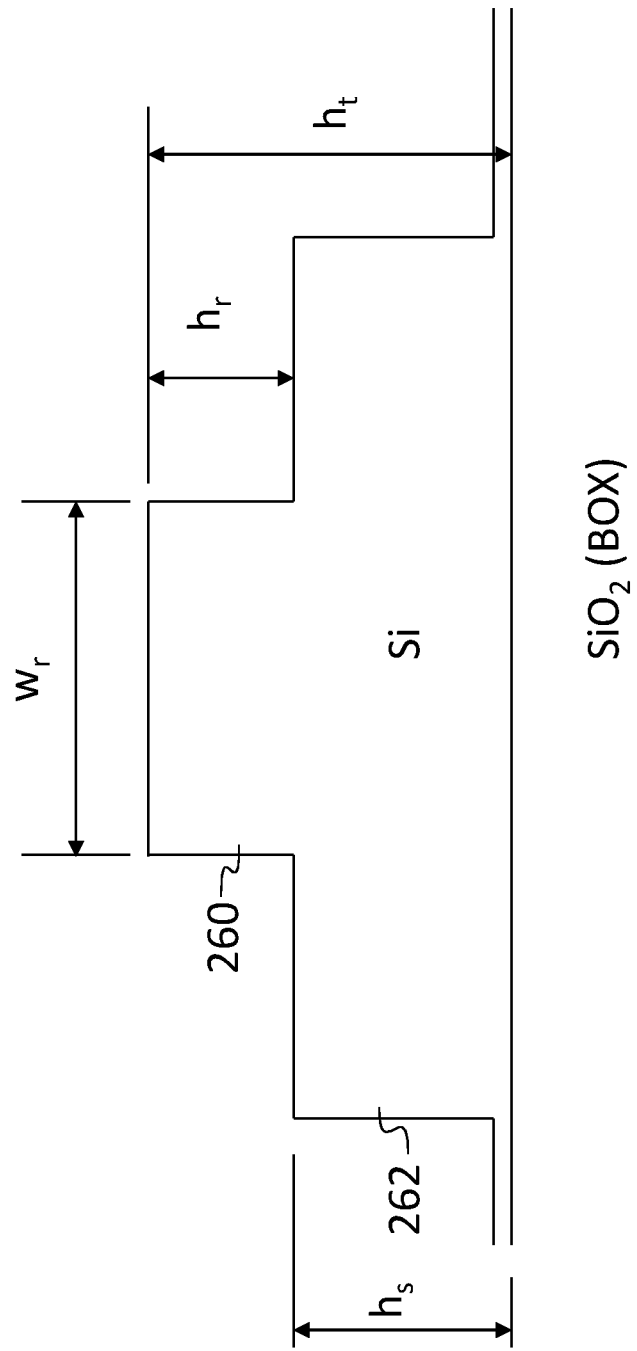
FIG. 2R is a cross-sectional view of a rib waveguide, according to an embodiment of the present invention.
Figure 2S:
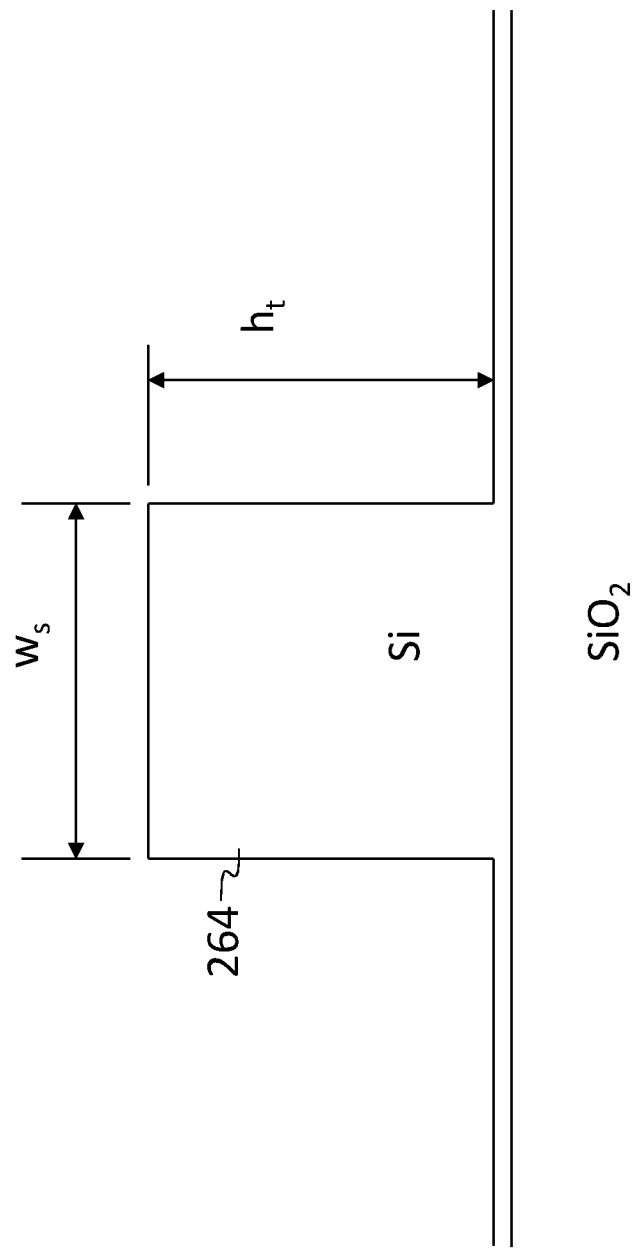
FIG. 2S is a cross-sectional view of a strip waveguide, according to an embodiment of the present invention.

FIG. 2R shows a cross section (at a cutting plane perpendicular to the direction of propagation) of a rib waveguide, showing the rib portion 260 and the slab portion 262 and their respective heights $h_r$ and $h_s$, as well as the total height $h_t$ of the waveguide. Each of the height $h_r$ of the rib portion 260 and the height $h_s$ of the slab portion 262 may be between 0.5 and 2.5 microns; in some embodiments the height of the rib portion is about 1.2 microns and the height of the slab portion is about 1.8 microns. The width $w_r$ of the rib portion 260 may be between 1 and 10 microns, e.g., it may be 3 microns. FIG. 2S shows a cross section (at a cutting plane perpendicular to the direction of propagation) of a strip waveguide, showing the height $h_t$ and the width $w_s$ of the strip or "ridge" 264. In some embodiments each of the height and the width of the strip is between 2 and 5 microns; in some embodiments the height and the width of the strip are both about 3 microns.

An output coupler 120 constructed according to any of the embodiments disclosed herein may have a reflectance of between 5% and 50%, and the reflectance may be constant to 10% (or to a level between 3% and 20%) over the wavelength range of operation of the multichannel laser source. As used herein, a quantity being "constant to X %" over a range of values of a parameter means that the ratio of the maximum value of the quantity to the minimum value of the quantity, over the range of values of the parameter, is no more than 1.10. For example, if the reflectance of an output coupler 120 varies, over a range of wavelengths spanning 1.8 microns (e.g., a range of wavelengths extending from 1.2 microns to 3.0 microns) between a minimum value of 0.30 (30%) and a maximum of 0.33 (33%), then the reflectance of the output coupler 120 is constant to 10% over the range of wavelengths. Similarly, one value differing from another value by X %, means that the ratio of the larger value to the smaller value is 1.1. For example, if an output coupler 120 has a first reflectance at a first wavelength, and a second reflectance at a second wavelength, where the first reflectance is 0.30 (30%) and the second reflectance is 0.33 (33%), then the two reflectances differ by 10%.

Figure 3A:
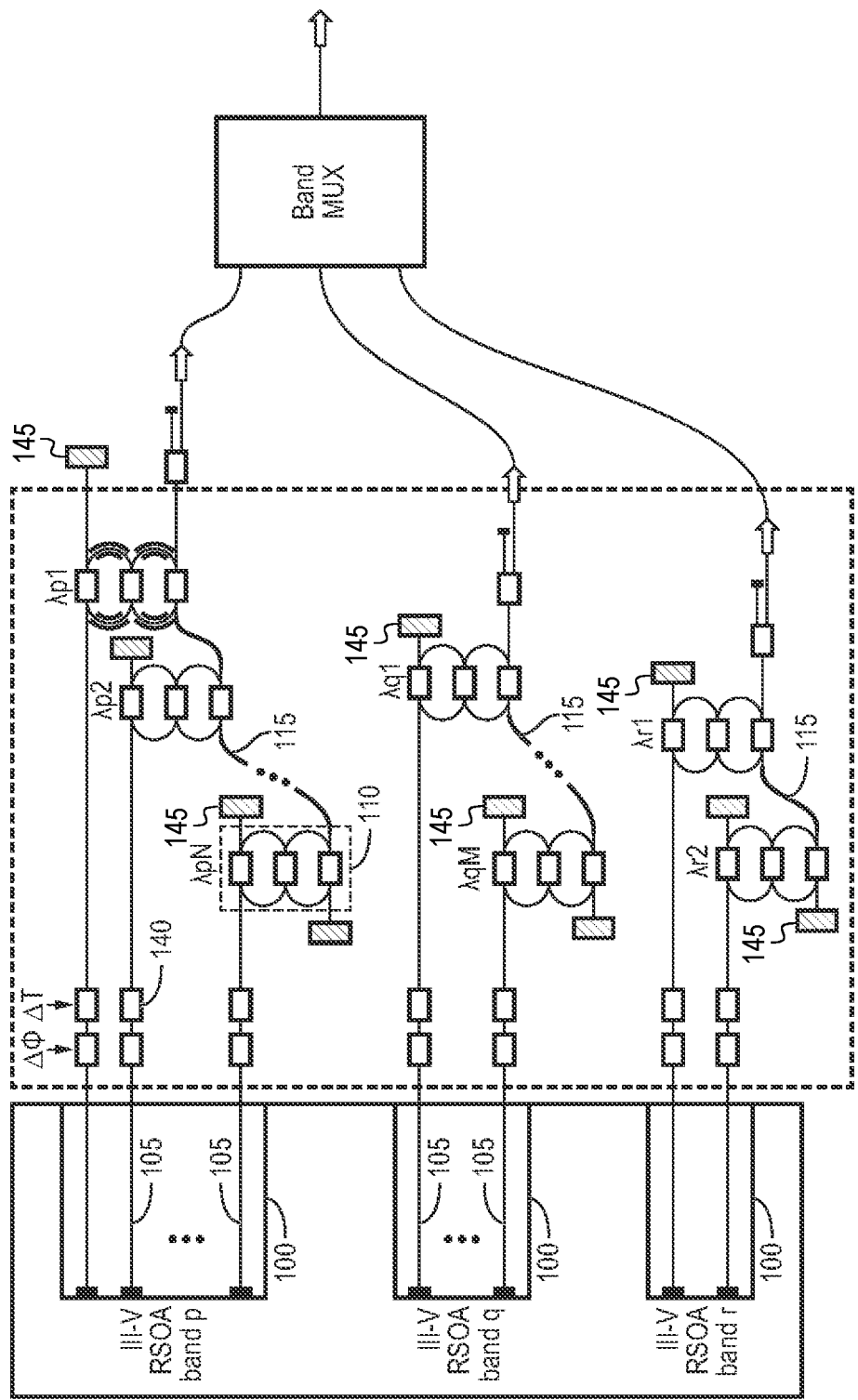
FIG. 3A is a schematic illustration of a multichannel laser source, according to an embodiment of the present invention.
Figure 3B:
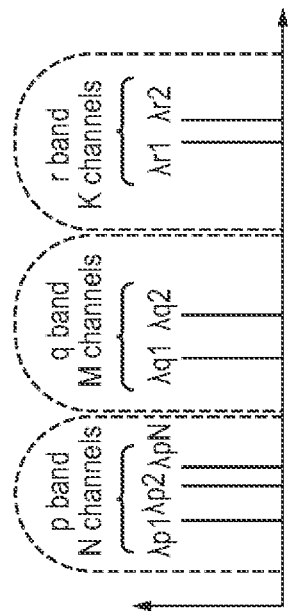
FIG. 3B is a schematic illustration of an optical spectrum, according to an embodiment of the present invention.

Referring to FIG. 3A, in a second embodiment a multichannel laser source includes a plurality of multichannel lasers each having a respective bus waveguide. A respective broadband partially reflective element acts, in each multichannel laser, as a respective output coupler 120 for all of the channels of the multichannel laser. The outputs of all of the multichannel lasers are combined in a band multiplexer (MUX), to form the output of the multichannel laser source. The embodiment of FIG. 3A may be used if the bandwidth of a readily available output coupler 120 (as used, for example, in the embodiment of FIG. 1A) is not sufficient to cover a desired spectral span, or if the cavity length would be too long if the multichannel laser source were constructed according to FIG. 1A. The embodiment of FIG. 3A may be more compact than the embodiment of FIG. 1A, if the band MUX is compact. FIG. 3B shows an example of an optical spectrum that may be generated by the embodiment of FIG. 3A.

As used herein, a multichannel laser refers to a laser having a plurality of channels, such as the laser of FIG. 1A, and being capable of producing light at more than one wavelength simultaneously, the channels sharing at least one element (e.g., the output coupler 120 of FIG. 1A). As used herein, a multichannel laser source refers to a light source that is capable of producing light at more than one wavelength simultaneously, and that includes one or more lasers (such as the embodiment illustrated in FIG. 3A, which includes three multichannel lasers).

FIG. 3A shows one bus waveguide for each band, i.e., for each of the RSOA chips 100, but this correspondence is not required. Each bus waveguide may collect light from a plurality of channels using a single RSOA chip 100 as illustrated, or it may collect light from a plurality of channels using more than one different RSOA chip 100 (e.g., it may collect light from one or more channels using a first RSOA chip 100 and from one or more channels using a second RSOA chip 100), or each of a plurality of bus waveguides may collect light from a respective subset of a plurality of channels using a single RSOA chip 100.

Figure 4:
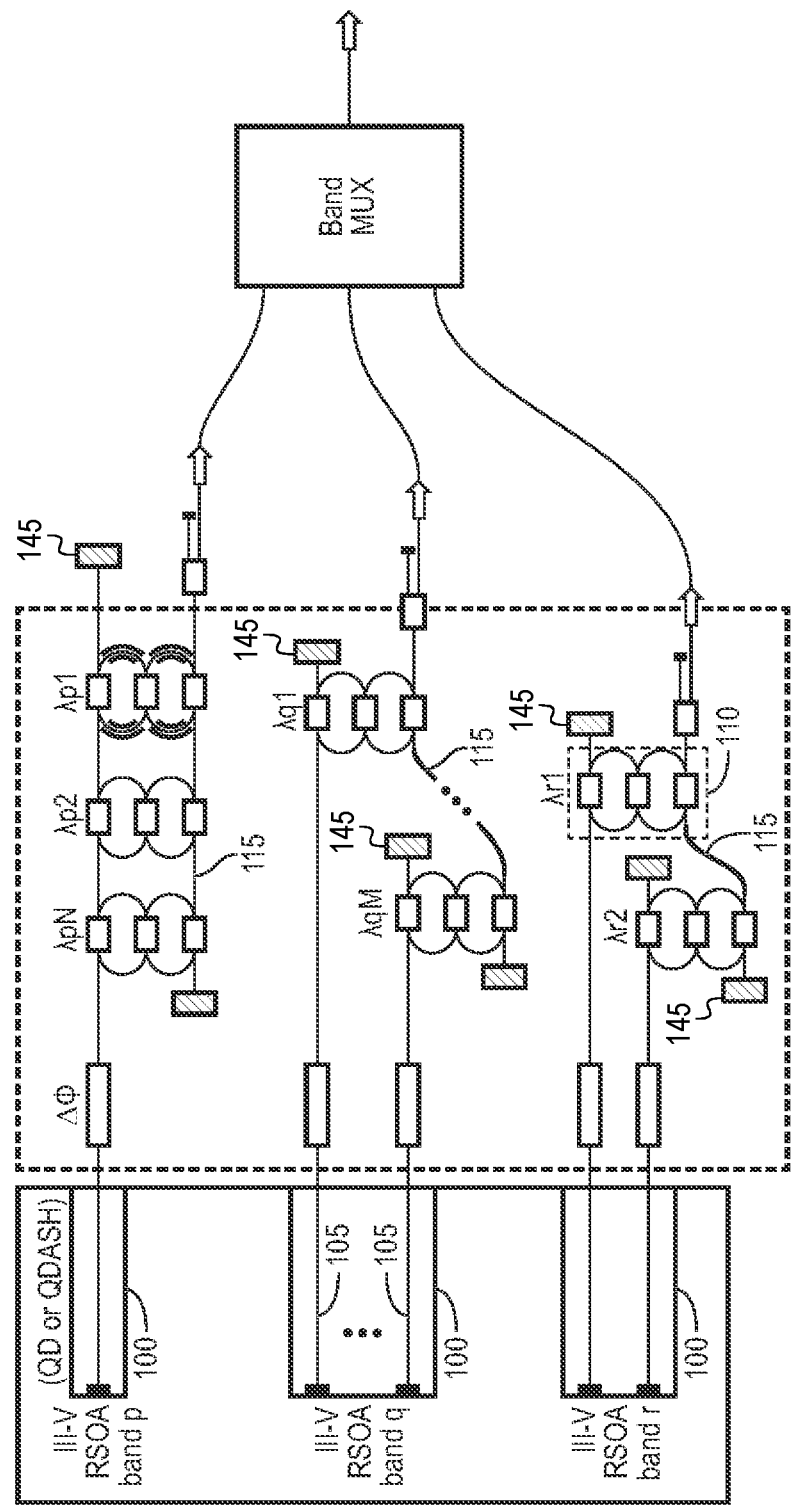
FIG. 4 is a schematic illustration of a multichannel laser source, according to an embodiment of the present invention.

Referring to FIG. 4, a third embodiment may be more compact than the embodiments of FIGS. 1A and 3A, if an inhomogeneously broadened RSOA material is used (such as quantum dot (QD) or quantum dash (QDASH) material) in one or more of the RSOA chips 100 instead of a quantum well (QW) heterostructure. Inhomogeneously broadened gain materials can support lasing of multiple modes in a single waveguide (i.e., in a single RSOA) in the RSOA chip 100. The wavelength spacing between channels sharing an RSOA in the QD or QDASH RSOA chip may be larger than the homogeneous broadening width of the RSOA material, so that the channels do not compete for gain to a significant extent. QD or QDASH materials may not be readily available for all bands of the multichannel laser source; accordingly some of the RSOA chips 100 may use such materials, and some others may use other materials. The RSOA chips that are inhomogeneously broadened may then have more than one channel per RSOA (i.e., per waveguide in the RSOA chip). In the embodiment of FIG. 4, the top-most RSOA chip (used for the "p" wavelength band) is inhomogeneously broadened and includes only one RSOA 105, which supports multiple channels (of which three are shown) simultaneously; the other two RSOA chips 100 are configured to have only one channel per RSOA. FIG. 3B shows an example of an optical spectrum that may be generated by the embodiment of FIG. 4.

It will be understood that in some embodiments, single ring resonators, or composite ring resonators including more than two ring resonators, may be used in place of one or more of the vernier ring resonator filters 110 of the embodiments of FIGS. 1A, 3A and 4. It will be understood that although only three RSOA chips and three bands are illustrated in FIGS. 1A, 3A, and 4, a multichannel laser or multichannel laser source may include more or fewer RSOA chips and bands.

Figure 5:
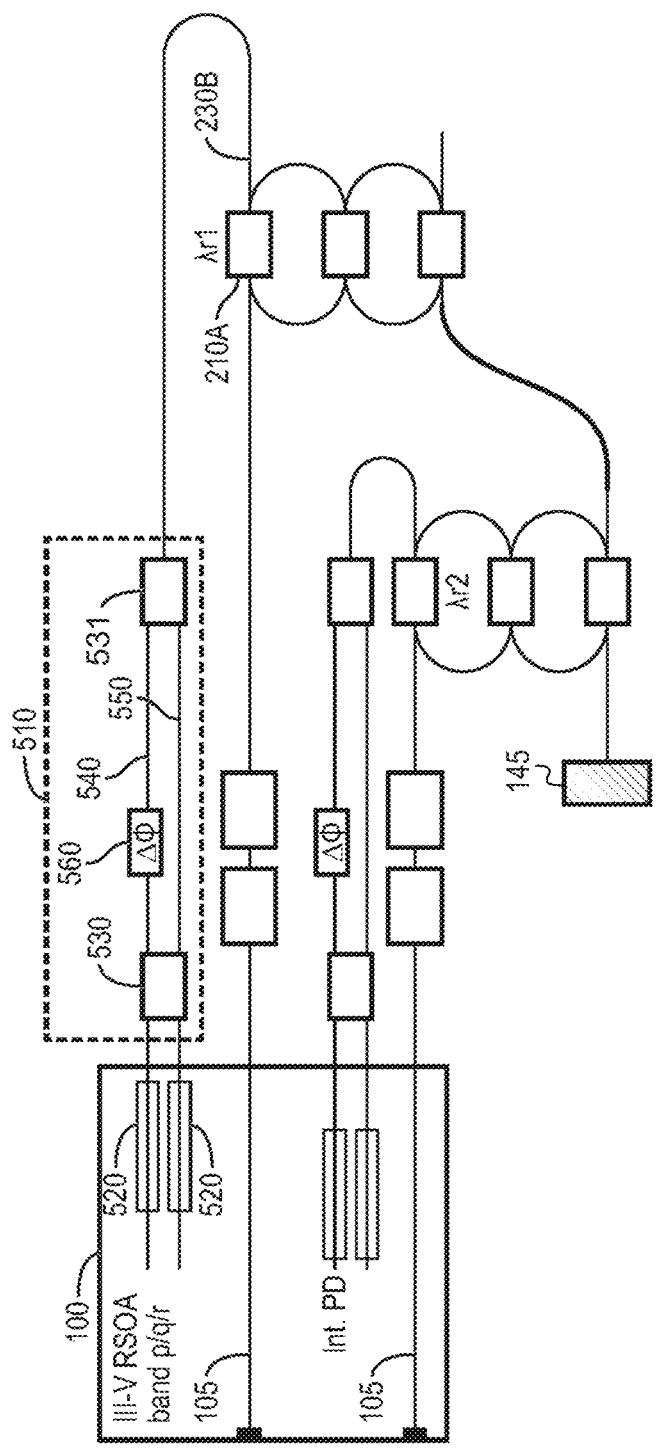
FIG. 5 is a schematic illustration of a system for wavelength sensing, according to an embodiment of the present invention.

Referring to FIG. 5, in some embodiments wavelength sensing may be performed using an unequal-arm Mach-Zehnder interferometer 510 and two photodetectors 520. Each of the photodetectors 520 may include a reverse-biased junction on or coupled to a waveguide, and may be fabricated on an RSOA chip 100 operating in the same wavelength band. The Mach-Zehnder interferometer 510 includes a first MMI 530 that acts as a splitter, and a second MMI 531 that acts as a combiner. The waveguide of a first arm 540 of the Mach-Zehnder interferometer 510 may lie alongside the waveguide of the second arm 550 of the Mach-Zehnder interferometer 510, except for a portion 560 that may be longer than a corresponding portion of the second arm 550 and may result in the length difference between the two arms 540, 550. The temperature of the Mach-Zehnder interferometer 510 may be sensed and controlled, to reduce the differential phase change in the Mach-Zehnder interferometer 510 that otherwise may occur if the temperature (and, as a result, the differential optical path delay) of the Mach-Zehnder interferometer 510 were to change. FIG. 5 shows two channels of a multichannel laser source which has more than two channels (the remainder of which are not shown in FIG. 5).

The lengths of the two arms 540, 550 may be selected so that when the wavelength of light received by the Mach-Zehnder interferometer 510 is the desired wavelength, the respective photocurrents generated by the two photodetectors 520 are equal. Accordingly, a feedback circuit may form an error signal by calculating (e.g., using a differential amplifier) the difference between two photocurrents, and the error signal may be amplified and filtered and fed back to one or more elements (or "wavelength actuators") for adjusting the wavelength. Such a wavelength actuator may be part of a wavelength-dependent coupler (and may be referred to as a "coupler wavelength actuator") and may be, for example, a phase shifter (e.g., a heater, or a p-i-n junction) on one or more of (e.g., on all of) the half-rings, on a tunable grating-assisted co-directional coupler (discussed in further detail below) and/or on a distributed Bragg reflector (discussed in further detail below). In some embodiments, if the free spectral range of the laser cavity of a channel is greater than the resonant bandwidth of the wavelength-dependent coupler, the phase shifter 130 may be controlled so as to keep a resonant frequency of the laser cavity within the resonant bandwidth of the wavelength-dependent coupler. In such an embodiment, the phase shifter 130 acts as an additional wavelength actuator that may simply follow the center wavelength of the wavelength-dependent coupler, or that may provide finer (or faster) wavelength control than the phase shifter of the wavelength-dependent coupler. In this manner each output wavelength may be controlled. Each of the output wavelengths may also be tunable, for example by adding an offset signal to the error signal before it is amplified and filtered by the feedback circuit. The Mach-Zehnder interferometer 510 may be fed a portion of the light emitted by the RSOA of the channel for which the wavelength is to be measured, e.g., it may be fed by light from the output port 230B of the first MMI 210A of a respective vernier ring resonator filter of the channel for which the wavelength is to be measured (and controlled), as shown in FIG. 5.

Figure 6:
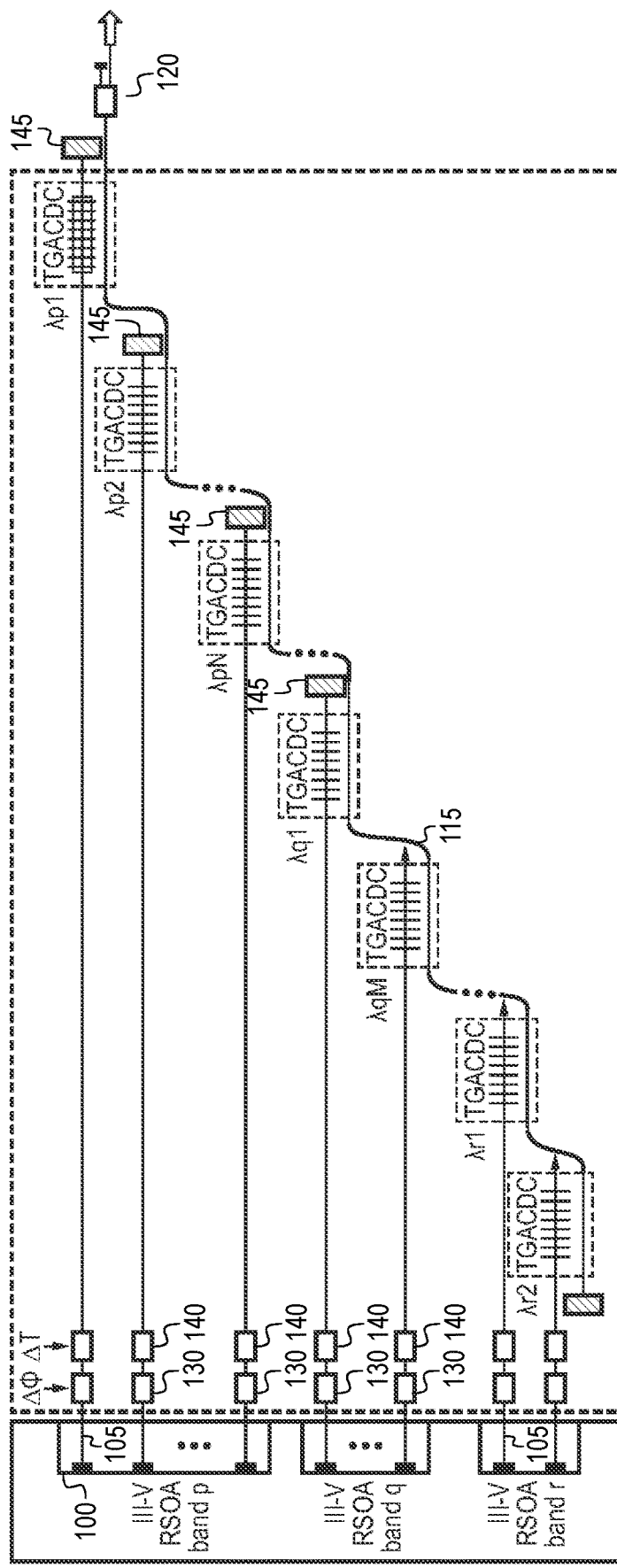
FIG. 6 is a schematic illustration of a multichannel laser source, according to an embodiment of the present invention.

FIG. 6 shows an embodiment of a multichannel laser that is analogous to the embodiment of FIG. 1A, in which the vernier ring resonator filters 110 of FIG. 1A have been replaced with grating-assisted co-directional couplers (e.g., tunable grating-assisted co-directional couplers (TGACDCs)) of a first type. These grating-assisted co-directional couplers operate as wavelength-dependent couplers, as discussed in further detail below. In a manner analogous to that of the embodiment of FIG. 1A, in the embodiment of FIG. 6 a TGACDC is employed, for each channel, to perform gain selection inside the laser cavity to select the lasing wavelength, and to combine the lasing light with that of other channels into the single bus waveguide 115, all inside a laser cavity having a shared output coupler 120. FIG. 1B shows an example of an optical spectrum that may be generated by the embodiment of FIG. 6.

Figure 7:
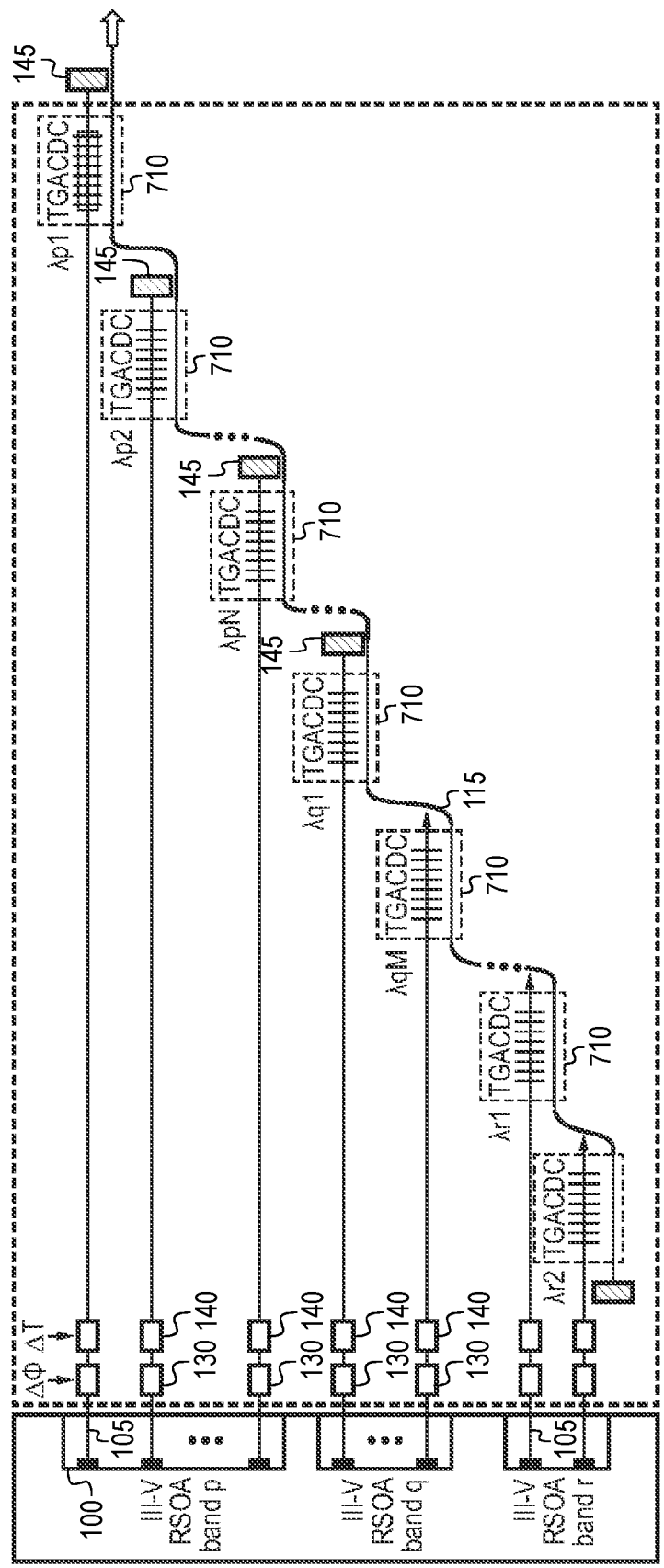
FIG. 7 is a schematic illustration of a multichannel laser source, according to an embodiment of the present invention.
Figure 8:
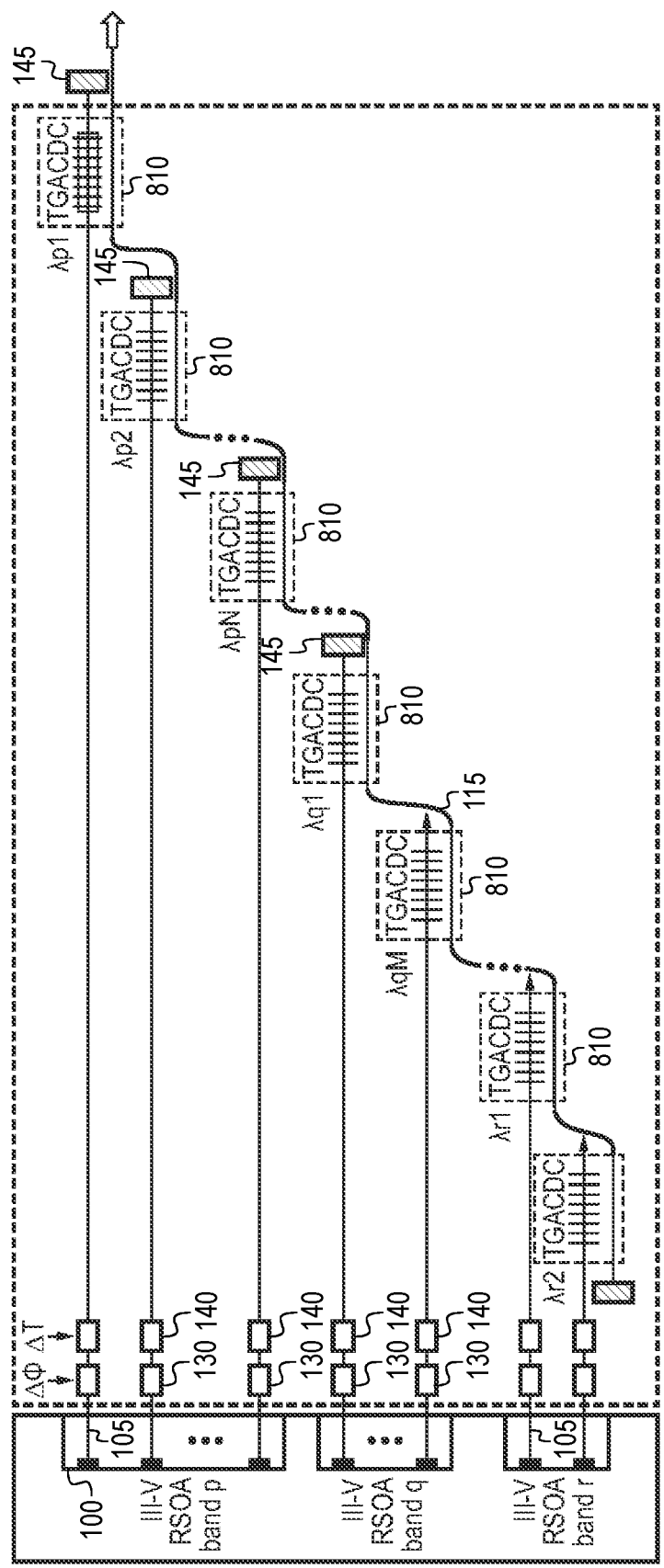
FIG. 8 is a schematic illustration of a multichannel laser source, according to an embodiment of the present invention.

FIGS. 7 and 8 show embodiments of multichannel laser sources each including a plurality of channels, using TGACDCs as both wavelength-selective output couplers and as couplers for combining the light generated by the plurality of channels. FIGS. 7 and 8 use TGACDCs of a second and third type, respectively, as discussed in further detail below.

Figure 9A:
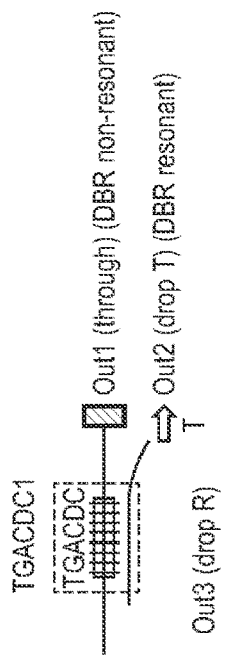
FIG. 9A is a schematic illustration of a tunable grating-assisted co-directional coupler of a first type, according to an embodiment of the present invention.

Three different types of TGACDCs may be used: i) a first type (as described in Z.-M. Chuang and L. A. Coldren, IEEE JQE 29 (4) 1993 p. 1071) designed to 100% transmit distributed Bragg reflector (DBR) resonant wavelengths to the drop T port (FIG. 9A, "TGACDC1"), ii) a second type designed to partially reflect DBR resonant wavelengths back to the RSOA (FIG. 9B, "TGACDC2"), and partially transmit resonant wavelengths to the drop T port, and iii) a third, composite type, consisting of a regular DBR (as described in A. J. Zilkie et al., "Power-efficient III-V/Silicon external cavity DBR lasers," Opt. Express 20, 23456-23462 (2012)) combined with a TGACDC of the first type, to form a composite device (FIG. 9C, "TGACDC3"), also designed to partially reflect DBR resonant wavelengths (wavelengths that are resonant both in the DBR and in the included TGACDC of the first type) back to the RSOA, partially transmit resonant wavelengths to the following TGACDC of the first type, and further 100% transmit (by the TGACDC of the first type) the resonant wavelengths to the drop T port. A composite TGACDC of the third type may behave qualitatively like a TGACDC of the second type, and may be used instead of a TGACDC of the second type to avoid difficult design constraints that may be present in a TGACDC of the second type. Off resonance (i.e., for wavelengths for which the TGACDC is not resonant) each of the three types TGACDC may behave as two substantially independent, parallel waveguides, with little or no coupling between them (i.e., light passing straight through the top waveguide with little or no coupling to the drop waveguide), and little or no reflection from the TGACDC.

In some embodiments all grating DBR wavelengths are made tunable by adding a waveguide integrated heater to the grating (e.g., using a metal on waveguide heater or a Si-doped integrated heater, possibly with an undercut to make it more efficient).

As mentioned above, if a TGACDC of the first type (the type of FIG. 9A) is used (as illustrated in FIG. 6, for example), each TGACDC performs the same function as one of the vernier ring resonator filters 110 of FIG. 1A, and all of the lasers (at different respective wavelengths) share an output mirror, the output mirror for all of the lasers being the common output mirror 120 shown.

Referring to FIG. 7, if a TGACDC of the second type 710 (the type of FIG. 9B) is used, the TGACDC 710 acts like a regular DBR mirror but transmits laser output light out to the bus waveguide. In this case no common output mirror is needed as each wavelength's output mirror is the respective TGACDC 710. This also provides the advantage that the cavity length for the respective laser at each wavelength is much shorter, close to a traditional single channel DBR, meaning that the cavity FSR is much larger, and each laser may therefore have a much larger tuning range between mode hops, and the number of lasers that can be added is not limited. A suitable TGACDC 710 of the type of FIG. 9B may however be more difficult to design and may have more design constraints and/or be more difficult to fabricate. FIG. 1B shows an example of an optical spectrum that may be generated by the embodiment of FIG. 7.

Figure 9B:
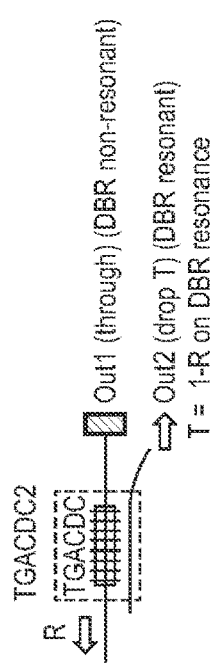
FIG. 9B is a schematic illustration of a tunable grating-assisted co-directional coupler of a second type, according to an embodiment of the present invention.
Figure 9C:
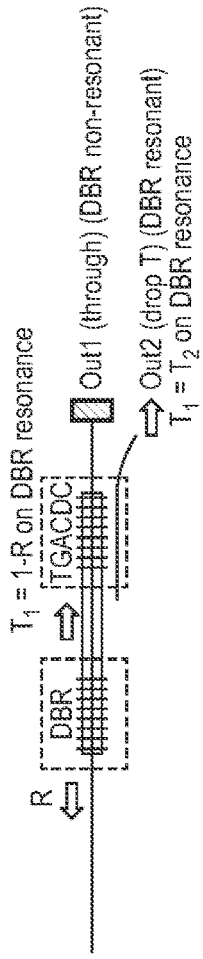
FIG. 9C is a schematic illustration of a tunable grating-assisted co-directional coupler of a third type, according to an embodiment of the present invention. Each of FIGS. 2R and 2S is drawn to scale for a respective embodiment.

A TGACDC of the third type (the type of FIG. 9C) is an alternative implementation to the TGACDC of the type of FIG. 9B, but would have design constraints and/or fabrication difficulties relaxed because the DBR that acts as the laser mirror is separated from the GACDC functionality. FIG. 8 shows a multichannel laser source using TGACDCs of the third type 810. In FIG. 8 each composite TGACDC of the third type 810 is illustrated for simplicity as a simple TGACDC. FIG. 1B shows an example of an optical spectrum that may be generated by the embodiment of FIG. 8. Although the grating-assisted co-directional couplers are, in the descriptions of some embodiments, referred to as TGACDCs ("tunable grating-assisted co-directional couplers"), in some embodiments the grating-assisted co-directional couplers are not tunable.

In each of FIGS. 6, 7, and 8, wavelength sending and control may be performed by feeding a portion of the light emitted by the RSOA of the channel for which the wavelength is to be measured to a suitable wavelength sensor (as described, for example, with reference to FIG. 5), e.g., the wavelength sensor may be fed a portion of the power out of the "out1 through" port of the TGACDC. In other embodiments this port of the TGACDC is coupled to an optical absorber to prevent parasitic cavities or light from this port being back-reflected into the laser cavity or the bus waveguide.

As used herein, a "wavelength-dependent coupler" is an optical device with at least three ports, including a channel port, a bus input, and a bus output, and in which the coupling between ports, or the reflectance of one or more ports, depends on the wavelength of light fed to the wavelength-dependent coupler. The ports of the wavelength-dependent coupler may also be referred to by other names, as, for example, in the descriptions above of vernier ring resonator filters and of grating-assisted co-directional couplers. In some embodiments (e.g., those of FIG. 1A and FIG. 6), light fed to the channel port at a resonant wavelength of the wavelength-dependent coupler may be largely transmitted to the bus output of the wavelength-dependent coupler (e.g., with loss of between 0.1 dB and 1.0 dB, or of less than 0.1 dB), and light fed to the bus input at a wavelength different from the resonant wavelength of the wavelength-dependent coupler (or different from every resonant wavelength of the wavelength-dependent coupler, if it has more than one resonant wavelength) may be largely transmitted (e.g., with loss of between 0.1 dB and 1.0 dB, or of less than 0.1 dB) to the bus output of the wavelength-dependent coupler. The reflectance back to the channel port and the reflectance back to the bus input may be between 10% and 1%, e.g., less than 5% or even less than 1%. In other embodiments (e.g., those of FIGS. 7 and 8), light fed to the channel port at a resonant wavelength of the wavelength-dependent coupler may be partially reflected (e.g., with a reflectance of between 10% and 50%), and partially transmitted (e.g., with a transmittance of between 40% and 90%) to the bus output of the wavelength-dependent coupler, and light fed to the bus input at a wavelength different from the resonant wavelength of the wavelength-dependent coupler (or different from every resonant wavelength of the wavelength-dependent coupler, if it has more than one resonant wavelength) may be largely transmitted (e.g., with loss of between 0.1 dB and 1.0 dB, or of less than 0.1 dB) to the bus output of the wavelength-dependent coupler. The reflectance (i) back to the channel port, at a wavelength different from the resonant wavelength of the wavelength-dependent coupler (or different from every resonant wavelength of the wavelength-dependent coupler, if it has more than one resonant wavelength) and (ii) back to the bus input, may be between 10% and 1%, e.g., less than 5% or even less than 1%. A wavelength-dependent coupler may have a fourth port that may (as mentioned above) be connected to an optical absorber or that may be used as a source of a portion of the light generated in one of the channels, for use in a wavelength sensing and control system for the channel. Both possible uses of the fourth port are illustrated in FIGS. 6, 7, and 8, with arrows at the fourth ports of two of the wavelength-dependent couplers denoting light sent to a wavelength sensor. In some embodiments, the 3 dB bandwidth of the resonant characteristic of a wavelength-dependent coupler is between 0.01 nm and 1.00 nm.

As mentioned above, the vernier ring resonator filters (e.g., of FIG. 1A) and the grating-assisted co-directional couplers (e.g., TGACDCs) described herein are examples of wavelength-dependent couplers. For example, in FIG. 1A the channel port of the each of the vernier ring resonator filters is the upper left port, the bus input is the lower left port, the bus output is the lower right port, and the fourth port is the upper right port.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X−Y and the second quantity is at most X+Y. As used herein, when a second number is "within Y %" of a first number, it means that the second number is between (i) (1−Y/100) times the first number and (ii) (1+Y/100) times the first number. As used herein, when a quantity is "constant to Y %", it means that the ratio of the maximum value of the quantity to the minimum value of the quantity is less than (1+Y/100)/(1−Y/100). As used herein, the word "or" is inclusive, so that, for example, "A or B" means any one of (i) A, (ii) B, and (iii) A and B. Any numerical range recited herein is intended to include all sub-ranges of the same numerical precision subsumed within the recited range. For example, a range of "1.0 to 10.0", or a range of "between 1.0 and 10.0", is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range defined as the set of values within 10% of 5.8 microns includes all values between (i) 0.90 times 5.8 microns and (ii) 1.1 times 5.8 microns. Any maximum numerical limitation recited herein is intended to include all lower numerical limitations subsumed therein and any minimum numerical limitation recited in this specification is intended to include all higher numerical limitations subsumed therein.

Although exemplary embodiments of a multichannel laser source have been specifically described and illustrated herein, many modifications and variations will be apparent to those skilled in the art. Accordingly, it is to be understood that a multichannel laser source constructed according to principles of this invention may be embodied other than as specifically described herein. The invention is also defined in the following claims, and equivalents thereof.

What is claimed is:

1. A multi-channel laser source, comprising:
   a bus waveguide coupled, at an output end of the bus waveguide, to an output of the multi-channel laser source;
   a first semiconductor optical amplifier;
   a first back mirror;
   a first wavelength-dependent coupler having a first resonant wavelength;
   a second semiconductor optical amplifier;
   a second back mirror;
   a second wavelength-dependent coupler having a second resonant wavelength, different from the first resonant wavelength;
   a third wavelength-dependent coupler having a third resonant wavelength, different from the first and second resonant wavelengths; and
   an output mirror at the output end of the bus waveguide,
   the first semiconductor optical amplifier including inhomogeneously broadened gain material and comprising:
     a first end coupled to the first back mirror, and
     a second end,
   the first wavelength-dependent coupler comprising:
     a channel port connected to the second end of the first semiconductor optical amplifier;
     a bus output connected to a first portion of the bus waveguide;
     a bus input, connected to a second portion of the bus waveguide more distant from the output end of the bus waveguide than the first portion of the bus waveguide; and
     a fourth port,
   the third wavelength-dependent coupler comprising:
     a channel port connected to the fourth port of the first wavelength-dependent coupler;
     a bus input, connected to the first portion of the bus waveguide; and
     a bus output, connected to a third portion of the bus waveguide nearer the output end of the bus waveguide than the first portion of the bus waveguide,
   the second semiconductor optical amplifier being coupled to the second portion of the bus waveguide through the second wavelength-dependent coupler,
   the first wavelength-dependent coupler being nearer to the output end of the bus waveguide than the second wavelength-dependent coupler,
   the first wavelength-dependent coupler being configured to transmit light, at the second resonant wavelength, from the bus input of the first wavelength-dependent coupler to the bus output of the first wavelength-dependent coupler, and
   the output mirror having a first reflectance at the first resonant wavelength and a second reflectance at the second resonant wavelength, the first reflectance differing from the second reflectance by no more than 10%.

2. The multi-channel laser source of claim 1, wherein the output mirror has a reflectance that is constant, over a wavelength range spanning 150 nm, to 10%.

3. The multi-channel laser source of claim 1, wherein the output mirror has a reflectance that is constant, over a wavelength range spanning 500 nm, to 10%.

4. The multi-channel laser source of claim 1, wherein the output mirror has a reflectance that is constant, over a wavelength range spanning 1000 nm, to 10%.

5. The multi-channel laser source of claim 1, wherein:
   the output mirror comprises a transverse slot in the bus waveguide,
   the transverse slot extends at least half-way through the total height of the bus waveguide,
   the transverse slot is tapered, and
   a facet on a side of the transverse slot nearer the output of the multi-channel laser source is oblique to the bus waveguide at the output mirror.

6. The multi-channel laser source of claim 1, wherein the output mirror comprises a directional coupler and a waveguide loop.

7. The multi-channel laser source of claim 1, wherein the output mirror is at an edge of a silicon photonics chip and the output mirror is configured to launch light into free space.

8. The multi-channel laser source of claim 1, wherein the output mirror comprises a chirped distributed Bragg reflector.

9. The multi-channel laser source of claim 1, wherein:
   the first wavelength-dependent coupler is configured:
     to reflect a first portion of light received at the first resonant wavelength at the channel port of the first wavelength-dependent coupler, and
     to transmit, to the bus output of the first wavelength-dependent coupler, a second portion of light received at the first resonant wavelength at the channel port of the first wavelength-dependent coupler;
   the first portion is at least 10% of the light received; and
   the second portion is at least 40% of the light received.

10. The multi-channel laser source of claim 1, wherein the first wavelength-dependent coupler comprises a first ring resonator and a second ring resonator, the first ring resonator and the second ring resonator being configured to operate as a vernier ring resonator filter, or
    wherein the first wavelength-dependent coupler comprises a grating assisted co-directional coupler.

11. The multi-channel laser source of claim 1, wherein the first wavelength-dependent coupler comprises a grating assisted co-directional coupler, and
    wherein the first wavelength-dependent coupler further comprises a distributed Bragg reflector connected in cascade with the grating assisted co-directional coupler.

12. The multi-channel laser source of claim 1, wherein the first wavelength-dependent coupler comprises a wavelength actuator for adjusting the first resonant wavelength.

13. The multi-channel laser source of claim 1, further comprising an amplitude modulator between the first back mirror and the first wavelength-dependent coupler.

14. The multi-channel laser source of claim 1, wherein the first semiconductor optical amplifier is the same semiconductor optical amplifier as the second semiconductor optical amplifier.

15. The multi-channel laser source of claim 1, wherein the first semiconductor optical amplifier comprises a first waveguide in a first semiconductor chip and the second semiconductor optical amplifier comprises a second waveguide in the first semiconductor chip.

16. The multi-channel laser source of claim 1, wherein the first semiconductor optical amplifier comprises a waveguide in a first semiconductor chip, and the second semiconductor optical amplifier comprises a waveguide in a second semiconductor chip, different from the first semiconductor chip.

17. The multi-channel laser source of claim 1, further comprising:
   a wavelength sensor configured to receive a portion of, and to sense a wavelength of, light emitted by the first semiconductor optical amplifier; and a control system configured:
  to receive a wavelength sensing signal from the wavelength sensor,
  to calculate a difference between the wavelength sensing signal and a wavelength setpoint, and
  to apply a wavelength correction signal to a wavelength actuator, to reduce the difference between the wavelength sensing signal and the wavelength setpoint,
wherein:
  the first wavelength-dependent coupler comprises a coupler wavelength actuator for adjusting the first resonant wavelength,
  the wavelength actuator comprises the coupler wavelength actuator, and
  the wavelength sensor is configured to receive light from a fourth port of the first wavelength-dependent coupler.

18. The multi-channel laser source of claim 17, wherein:
  the first semiconductor optical amplifier comprises a waveguide in a first semiconductor chip; and
  the wavelength sensor comprises a photodiode, the photodiode being in the first semiconductor chip.

19. A multiplexed multi-channel laser source comprising:
  a first multi-channel laser source according to claim 1,
  a second first multi-channel laser source according to claim 1, and
  a multiplexer,
  the multiplexer comprising:
    a first input,
    a second input, and
    an output,
  the multiplexer being configured:
    to transmit light from first input to the output, and
    to transmit light from second input to the output.

20. The multi-channel laser source of claim 1, further comprising:
  an amplitude modulator between the first back mirror and the first wavelength-dependent coupler;
  a wavelength sensor; and
  a control system,
  the third wavelength-dependent coupler comprising a grating assisted co-directional coupler and a fourth port connected to the wavelength sensor,
  the third wavelength-dependent coupler being configured:
    to reflect a first portion of light received at the third resonant wavelength at the channel port of the third wavelength-dependent coupler;
    to transmit, to the bus output of the third wavelength-dependent coupler, a second portion of light received at the third resonant wavelength at the channel port of the third wavelength-dependent coupler; and
    to transmit, to the fourth port of the third wavelength-dependent coupler, a third portion of light received at the third resonant wavelength at the channel port of the third wavelength-dependent coupler,
  the wavelength sensor being configured to receive the third portion of, and to sense a wavelength of, light from the third wavelength-dependent coupler,
  the third wavelength-dependent coupler comprising a coupler wavelength actuator for adjusting the third resonant wavelength,
  the control system being configured:
    to receive a wavelength sensing signal from the wavelength sensor;
    to calculate a difference between the wavelength sensing signal and a wavelength setpoint; and
    to apply a wavelength correction signal to the coupler wavelength actuator, to reduce the difference between the wavelength sensing signal and the wavelength setpoint,
  the output mirror comprising:
    a 2×2 directional coupler directional coupler comprising:
      first and second waveguides that are parallel to each other within a coupling region and evanescently coupled to each other across a gap therebetween, a width of the gap and a length of the coupling region being set to control the bandwidth of the output coupler and a coupling ratio of the of the 2×2 directional coupler, the width of the gap being between 250 nm and 3 microns wide, and the length of the coupling region being up to 50 microns long,
      a first port coupling a first end of the first waveguide to the laser cavity,
      a second port coupling a first end of the second waveguide to the output; and
      and a waveguide loop coupling a second end of the first waveguide to a second end of the second waveguide.

* * * * *